(12) United States Patent
Iemura

(10) Patent No.: US 6,310,513 B1
(45) Date of Patent: Oct. 30, 2001

(54) DEMODULATOR AND DEMODULATION METHOD FOR DEMODULATING QUADRATURE MODULATION SIGNALS

(75) Inventor: Takaya Iemura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/492,232

(22) Filed: Jan. 27, 2000

(30) Foreign Application Priority Data

Jan. 25, 1999 (JP) .................................................. 11-015534
Feb. 18, 1999 (JP) .................................................. 11-039654

(51) Int. Cl.[7] .................................................... H03D 1/00
(52) U.S. Cl. .......................................... 329/304; 329/306
(58) Field of Search ................................. 329/304, 306, 329/307, 308, 347, 350

(56) References Cited

U.S. PATENT DOCUMENTS

| | | | |
|---|---|---|---|
| 4,606,051 | 8/1986 | Crabtree et al. | 375/86 |
| 5,440,587 | * 8/1995 | Ishikawa et al. | 329/304 |
| 5,533,060 | * 7/1996 | kameo et al. | 329/304 |
| 5,594,759 | * 1/1997 | Iwamatsu | 329/304 |
| 6,034,564 | * 3/2000 | Iwamatsu | 329/304 |
| 6,121,828 | * 9/2000 | Sasaki | 329/304 |

FOREIGN PATENT DOCUMENTS

| | | |
|---|---|---|
| 0 493 748 A2 | 7/1992 | (EP) . |
| 2-149155 | 6/1990 | (JP) . |
| 6-188928 | 7/1994 | (JP) . |
| 7-177188 | 7/1995 | (JP) . |
| 9-247228 | 9/1997 | (JP) . |
| 10-41992 | 2/1998 | (JP) . |
| 10-341267 | 12/1998 | (JP) . |

* cited by examiner

Primary Examiner—Tuan T. Lam
(74) Attorney, Agent, or Firm—Sughrue, Mion, Zinn, Macpeak & Seas, PLLC

(57) ABSTRACT

A demodulator for demodulating a modulation signal (IF IN) which has been modulated by means of quadrature modulation includes a quasi-coherent detection section, a demodulation section, a signal error detector, a phase error detector, a quadrature error detector and a quadrature controller. The signal error detector detects signal errors (Ei, Eq) and polarities (Di, Dq) of signals (I-ch5, Q-ch5) demodulated by the demodulator. The phase error detector detects the phase error (Pd) of the demodulated signals (I-ch5, Q-ch5) based on the signal errors (Ei, Eq) and the polarities (Di, Dq). In the quadrature error detector, a quadrature error (Qd') after phase rotation executed in the demodulation section is obtained by calculating Ei·Dq+Eq·Di, and thereafter a quadrature error (Qd) before the phase rotation is obtained by means of polarity switching based on the demodulated signals (I-ch5, Q-ch5) and a phase rotation angle signal (Ang) which is generated from the phase error (Pd). The quadrature controller executes complex multiplication to quadrature components (I-ch1, Q-ch1) obtained by the quasi-coherent detection section based on the quadrature error (Qd), and thereby the quadrature error in the demodulated signals (I-ch5, Q-ch5) is eliminated automatically.

26 Claims, 19 Drawing Sheets

F I G. 15
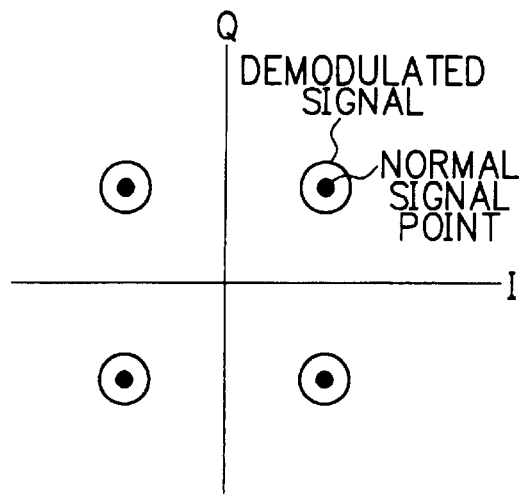
F I G. 16
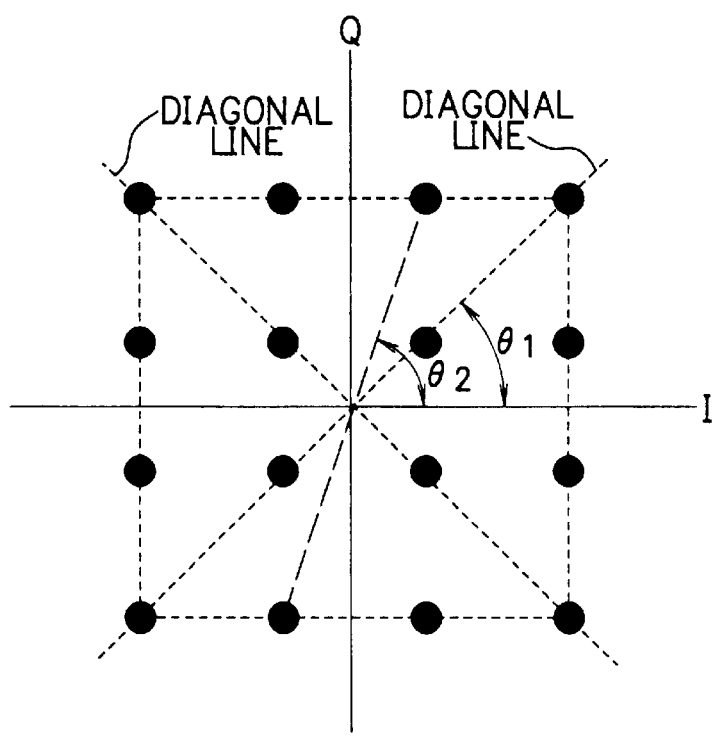

F I G. 18
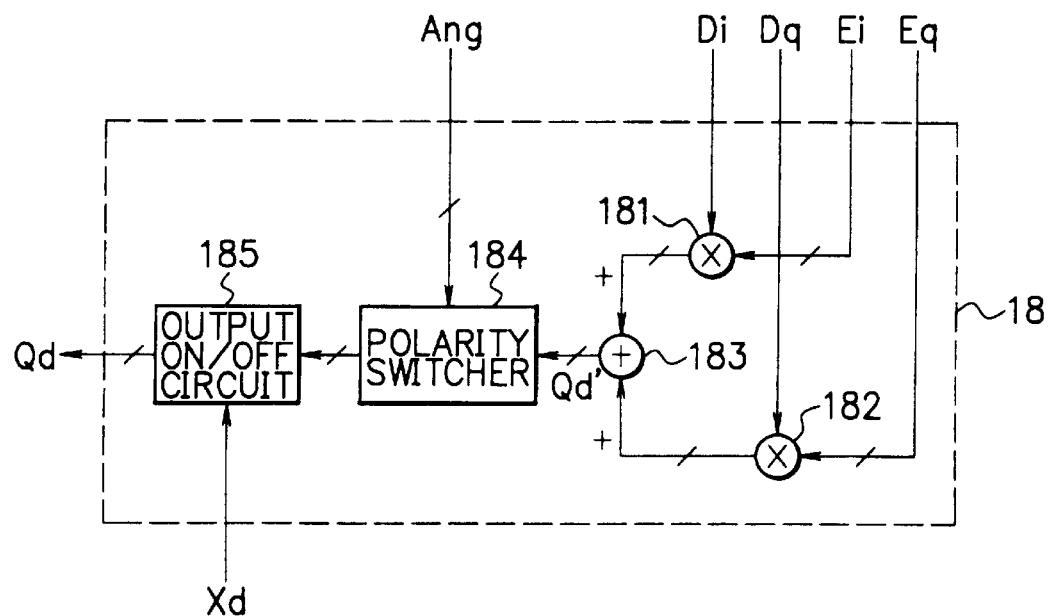

F I G. 20
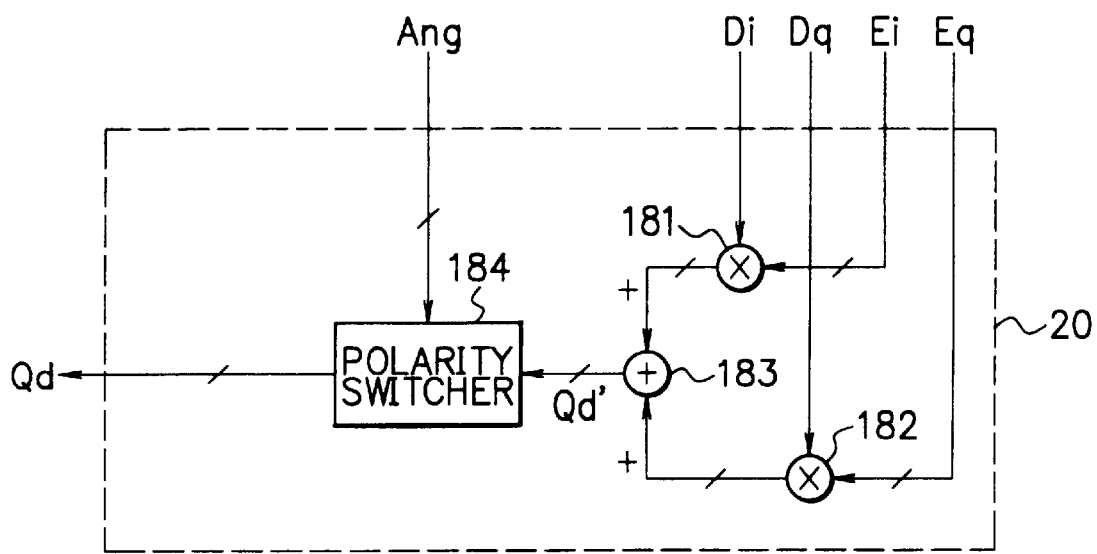

DEMODULATOR AND DEMODULATION METHOD FOR DEMODULATING QUADRATURE MODULATION SIGNALS

BACKGROUND OF THE INVENTION

The present invention relates to a demodulator which is employed in a modem etc. for demodulating digitally modulated signals, and in particular, to a demodulator for demodulating signals which have been modulated by means of quadrature modulation (PSK, QAM, etc.), including an automatic quadrature error elimination circuit.

DESCRIPTION OF THE PRIOR ART

FIG. 1 is a block diagram showing an example of a conventional demodulator. The conventional demodulator of FIG. 1 comprises multipliers 1 and 2, a local oscillator 3, a $\pi/2$ phase shifter 4, A/D converters 5 and 6, AGCs (Automatic Gain Controllers) 7 and 9, a complex multiplier 8, an NCO (Numerical Controlled Oscillator) 10, an LPF (LooP Filter) 11, a phase error detector 12, an amplitude error detector 13, and a signal error detector 14.

The local oscillator 3 outputs a local oscillation signal whose frequency is almost the same as that of the carrier of a modulation signal (IF (Intermediate Frequency) signal) which is inputted to the IF input terminal of the demodulator. The $\pi/2$ phase shifter 4 shifts the phase of the local oscillation signal outputted by the local oscillator 3 by $\pi/2$. The multiplier 1 multiplies the modulation signal (IF IN) by the local oscillation signal outputted by the local oscillator 3, and thereby a first signal component I-ch is obtained. The multiplier 2 multiplies the modulation signal (IF IN) by the $\pi/2$-shifted local oscillation signal outputted by the $\pi/2$ phase shifter 4, and thereby a second signal component Q-ch is obtained. The first signal component I-ch outputted by the multiplier 1 is converted by the A/D converter 5 into a digital signal I-ch1, and the second signal component Q-ch is converted by the A/D converter 6 into a digital signal Q-ch1. The AGC 7 which is supplied with the digital signals I-ch1 and Q-ch1 corrects the amplitude difference between the digital signals I-ch1 and Q-ch1, and thereby outputs digital signals I-ch3 and Q-ch3 in which the amplitude difference has been eliminated.

The complex multiplier 8, which is supplied with the digital signals I-ch3 and Q-ch3, corrects the digital signals I-ch3 and Q-ch3 by executing phase rotation using phase rotation signals Sin and Cos supplied from the NCO 10, and thereby outputs digital signals I-ch4 and Q-ch4 in which the effect of the frequency difference between the carrier frequency and the local oscillation frequency of the local oscillator 3 has been eliminated. The AGC 9 adjusts the amplitudes of the digital signals I-ch4 and Q-ch4 based on an amplitude error signal Ad supplied from the amplitude error detector 13 so that a signal point of demodulated signals I-ch5 and Q-ch5 outputted by the AGC 9 will be on a normal signal point.

The signal error detector 14, which is supplied with the demodulated signals I-ch5 and Q-ch5 from the AGC 9, outputs error signals Ei and Eq and polarity signals Di and Dq. The error signals Ei and Eq outputted by the signal error detector 14 indicate that the error of the signal point of the demodulated signals I-ch5 and Q-ch5 in comparison with a normal signal point is (Ei, Eq). The polarity signals Di and Dq outputted by the signal error detector 14 indicate sign bits (sign binary digits) of the demodulated signals I-ch5 and Q-ch5.

The amplitude error detector 13, which is supplied with the error signals Ei (or Eq) and the polarity signal Di (or Dq) from the signal error detector 14, calculates amplitude error of the demodulated signals I-ch5 and Q-ch5 and supplies the amplitude error signal Ad to the AGC 9. The phase error detector 12, which is supplied with the error signals Ei and Eq and the polarity signals Di and Dq from the signal error detector 14, calculates phase error of the demodulated signals I-ch5 and Q-ch5 and outputs a phase error signal Pd. The phase error signal Pd outputted by the phase error detector 12 is smoothed by the LPF 11 and the smoothed phase error signal Pd2 is supplied to the NCO 10. The NCO 10 generates the phase rotation signals Sin and Cos using the smoothed phase error signal Pd2 supplied from the LPF 11, and supplies the phase rotation signals Sin and Cos to the complex multiplier 8.

Among conventional demodulators composed of analog ICs, some demodulators executed quadrature adjustment of the output of the local oscillator 3 (i.e. correction of phase shift error of the $\pi/2$ phase shifter 4) automatically. However, there has not been an IC capable of executing high precision quadrature adjustment which is required of a multilevel quadrature demodulator. ICs have not been designed so as to be capable of being applied to signals which have been modulated by multilevel amplitude modulation such as QAM (Quadrature Amplitude Modulation). Therefore, correction of quadrature errors has been executed manually so far.

Concretely, the quadrature adjustment for the demodulator of FIG. 1 has been executed by slightly adjusting the phase difference of the $\pi/2$ phase shifter 4 manually. Therefore, conventional demodulators used to need extra time for the manual quadrature error correction.

Further, the phase difference of the manually adjusted $\pi/2$ phase shifter 4 tends to vary with time depending on the temperature of analog components, humidity, etc., and thus it is very difficult to guarantee the $\pi/2$ phase shift of the $\pi/2$ phase shifter 4 for the long term.

If the variations in the phase difference of the $\pi/2$ phase shifter 4 (i.e. the phase shift error) occurred, the quadrature error occurs in the demodulated signals outputted by the demodulator, thereby the characteristics of the demodulator such as the bit error rate are necessitated to be deteriorated.

SUMMARY OF THE INVENTION

It is therefore the primary object of the present invention to provide a demodulator for demodulating quadrature modulation signals, by which the quadrature error correction is executed digitally and automatically with no need of manual control and thereby deterioration of demodulation properties (bit error rate etc.) can be prevented for the long term.

Another object of the present invention is to provide a demodulation method for demodulating quadrature modulation signals, by which the quadrature error correction is executed digitally and automatically with no need of manual control and thereby deterioration of demodulation properties (bit error rate etc.) can be prevented for the long term.

In accordance with a first aspect of the present invention, there is provided a demodulator for demodulating a modulation signal (IF IN) which has been modulated by means of quadrature modulation, comprising a quasi-coherent detection means, a demodulation means, a signal error detection means, a phase error detection means, a quadrature error detection means and a quadrature error elimination means. The quasi-coherent detection means executes quasi-coherent detection to the modulation signal (IF IN) and thereby outputs quadrature components (I-ch1, Q-ch1). The demodulation means corrects amplitude errors of the quadrature components (I-ch1, Q-ch1) outputted by the quasi-coherent detection means, corrects frequency offset components and phase offset components of the quadrature components (I-ch1, Q-ch1), and thereby outputs demodulated signals (I-ch5, Q-ch5). The signal error detection means detects signal errors (Ei, Eq) and polarities (Di, Dq) of the demodulated signals (I-ch5, Q-ch5). The phase error detection means detects the phase error (Pd, Pd1) of the demodulated signals (I-ch5, Q-ch5) based on the signal errors (Ei, Eq) and the polarities (Di, Dq) so as to be used by the demodulation means. The quadrature error detection means detects a quadrature error (Qd) using at least the signal errors (Ei, Eq). The quadrature error elimination means executes complex multiplication to the quadrature components (I-5 ch1, Q-ch1) outputted by the quasi-coherent detection means based on the quadrature error (Qd) detected by the quadrature error detection means and thereby eliminates the quadrature error in the demodulated signals (I-ch5, Q-ch5).

In accordance with a second aspect of the present invention, in the first aspect, the quasi-coherent detection means includes a local scillator, a π/2 phase shifter, a first multiplier, a second multiplier, a first A/D converter and a second A/D converter. The local oscillator generates a local oscillation signal whose frequency is almost the same as that of the carrier of the modulation signal (IF IN). The π/2 phase shifter shifts the phase of the local oscillation signal outputted by the local oscillator by π/2. The first multiplier multiplies the modulation signal (IF IN) by the local oscillation signal outputted by the local oscillator. The second multiplier multiplies the modulation signal (IF IN) by the π/2-shifted local oscillation signal outputted by the π/2 phase shifter. The first A/D converter executes A/D conversion to the output of the first multiplier and thereby outputs the first quadrature component (I-ch1). The second A/D converter executes A/D conversion to the output of the second multiplier and thereby outputs the second quadrature component (Q-ch1).

In accordance with a third aspect of the present invention, in the first aspect, the demodulation means includes a first AGC (Automatic Gain Controller), a complex multiplier and a second AGC. The first AGC, which is supplied with signals (I-ch2, Q-ch2) outputted by the quadrature error elimination means, corrects the amplitude difference between the signals (I-ch2, Q-ch2) and thereby outputs signals (I-ch3, Q-ch3) in which the amplitude difference has been eliminated. The complex multiplier, which is supplied with the signals (I-ch3, Q-ch3) outputted by the first AGC, executes phase rotation to the signals (I-ch3, Q-ch3) using phase rotation signals (Sin, Cos) which are generated based on the phase error (Pd, Pd1) outputted by the phase error detection means and thereby outputs signals (I-ch4, Q-ch4) in which the frequency offset components and the phase offset components have been eliminated. The second AGC, which is supplied with the signals (I-ch4, Q-ch4) outputted by the complex multiplier, adjusts the amplitudes of the signals (I-ch4, Q-ch4) so that a corresponding signal point will be on a normal signal point and thereby outputs the demodulated signals (I-ch5, Q-ch5).

In accordance with a fourth aspect of the present invention, in the third aspect, the demodulator further comprises an amplitude error detection means. The amplitude error detection means detects the amplitude error (Ad) of the demodulated signals (I-ch5, Q-ch5) based on the signal errors (Ei, Eq) and the polarities (Di, Dq) so as to be used by the second AGC.

In accordance with a fifth aspect of the present invention, in the fourth aspect, the amplitude error detection means detects the amplitude error (Ad) by calculating Ei·Di or Eq·Dq.

In accordance with a sixth aspect of the present invention, in the first aspect, the signal error detection means detects the signal errors (Ei, Eq) by detecting errors of the demodulated signals (I-ch5, Q-ch5) in comparison with the i-coordinate and the q-coordinate of a normal signal point. The signal error detection means detects the polarities (Di, Dq) of the demodulated signals (I-ch5, Q-ch5) by detecting the sign bits of the demodulated signals (I-ch5, Q-ch5).

In accordance with a seventh aspect of the present invention, in the first aspect, the phase error detection means detects the phase error (Pd, Pd1) by calculating Eq·Di-Ei·Dq.

In accordance with an eighth aspect of the present invention, in the first aspect, the quadrature error detection means includes a quadrature error calculation means and a polarity switching means. The quadrature error calculation means obtains a quadrature error (Qd') by calculating Ei·Dq+Eq·Di. The polarity switching means judges whether or not the signal point of the signals (I-ch3, Q-ch3) in the I-Q complex plane before phase rotation executed in the demodulation means existed in a quadrant adjacent to a quadrant where the signal point of the demodulated signals (I-ch5, Q-ch5) after the phase rotation exists, based on the demodulated signals (1-ch5, Q-ch5) and a phase rotation angle signal (Ang) which is generated from the phase error (Pd, Pd1) detected by the phase error detection means. The polarity switching means inverts the polarity of the quadrature error (Qd') and outputs the inverted quadrature error as the quadrature error (Qd) if the signal point of the signals (I-ch3, Q-ch3) before the phase rotation existed in an adjacent quadrant. The polarity switching means directly outputs the quadrature error (Qd') as the quadrature error (Qd) if the signal point of the signals (I-ch3, Q-ch3) before the phase rotation did not exist in an adjacent quadrant.

In accordance with a ninth aspect of the present invention, in the first aspect, the demodulator further comprises a diagonal line detection means. The diagonal line detection means judges whether or not each signal point of the demodulated signals (I-ch5, Q-ch5) is a diagonal signal point. The quadrature error detection means detects the quadrature error (Qd) based on the signal errors (Ei, Eq), the polarities (Di, Dq), the output of the diagonal line detection means, and a phase rotation angle signal (Ang) which is generated from the phase error (Pd) detected by the phase error detection means.

In accordance with a tenth aspect of the present invention, in the ninth aspect, the quadrature error detection means includes a quadrature error calculation means, a polarity switching means and an output ON/OFF means. The quadrature error calculation means obtains a quadrature error (Qd') by calculating Ei·Dq+Eq·Di. The polarity switching means judges whether or not the signal point of the signals (I-ch3, Q-ch3) in the I-Q complex plane before phase rotation executed in the demodulation means existed in a quadrant adjacent to a quadrant where the signal point of the demodulated signals (I-ch5, Q-ch5) after the phase rotation exists, based on the phase rotation angle signal (Ang). The polarity switching means inverts the polarity of the quadrature error (Qd') and outputs the inverted quadrature error as the quadrature error (Qd) if the signal point of the signals (I-ch3, Q-ch3) before the phase rotation existed in an adjacent quadrant. The polarity switching means directly outputs the quadrature error (Qd') as the quadrature error (Qd) if the signal point of the signals (I-ch3, Q-ch3) before the phase rotation did not exist in an adjacent quadrant. The output ON/OFF means turns ON/OFF the output of the polarity switching means depending on the output of the diagonal line detection means.

In accordance with an eleventh aspect of the present invention, in the first aspect, the quadrature error detection means includes a quadrature error calculation means and a polarity switching means. The quadrature error calculation means obtains a quadrature error (Qd') by calculating Ei·Dq+Eq·Di. The polarity switching means judges whether or not the signal point of the signals (I-ch3, Q-ch3) in the I-Q complex plane before phase rotation executed in the demodulation means existed in a quadrant adjacent to a quadrant where the signal point of the demodulated signals (I-ch5, Q-ch5) after the phase rotation exists, based on a phase rotation angle signal (Ang) which is generated from the phase error (Pd, Pd1) detected by the phase error detection means. The polarity switching means inverts the polarity of the quadrature error (Qd') and outputs the inverted quadrature error as the quadrature error (Qd) if the signal point of the signals (I-ch3, Q-ch3) before the phase rotation existed in an adjacent quadrant. The polarity switching means directly outputs the quadrature error (Qd') as the quadrature error (Qd) if the signal point of the signals (I-ch3, Q-ch3) before the phase rotation did not exist in an adjacent quadrant.

In accordance with a twelfth aspect of the present invention, in the first aspect, the quadrature error detection means includes a reverse phase rotation means and a quadrature error calculation means. The reverse phase rotation means executes phase rotation to the signal errors (Ei, Eq) in reverse direction in comparison with the phase rotation executed in the demodulation means, using phase rotation signals (Sin, Cos) which are generated based on the phase error (Pd1) outputted by the phase error detection means, and thereby obtains signal errors (Ei', Eq') before the phase rotation. The quadrature error calculation means obtains the quadrature error (Qd) based on the signal errors (Ei', Eq') before the phase rotation and polarities (Di', Dq') of signals (I-ch2, Q-ch2) before the phase rotation by calculating Ei'·Dq'+Eq'·Di'.

In accordance with a thirteenth aspect of the present invention, in the first aspect, the quadrature error elimination means eliminates the quadrature error in the demodulated signals (I-ch5, Q-ch5) by smoothing the quadrature error (Qd) outputted by the quadrature error detection means by a lowpass filter, multiplying the second quadrature component (Q-ch1) by the smoothed quadrature error (sin δ), and adding the product to the first quadrature component (I-ch1).

In accordance with a fourteenth aspect of the present invention, there is provided a demodulation method for demodulating a modulation signal (IF IN) which has been modulated by means of quadrature modulation, comprising a quasi-coherent detection step, a demodulation step, a signal error detection step, a phase error detection step, a quadrature error detection step and a quadrature error elimination step. In the quasi-coherent detection step, quasi-coherent detection is executed to the modulation signal (IF IN) and thereby quadrature components (I-ch1, Q-ch1) are obtained. In the demodulation step, amplitude errors of the quadrature components (I-ch1, Q-ch1) obtained in the quasi-coherent detection step are corrected, frequency offset components and phase offset components of the quadrature components (I-ch1, Q-ch1) are corrected, and thereby demodulated signals (I-ch5, Q-ch5) are obtained. In the signal error detection step, signal errors (Ei, Eq) and polarities (Di, Dq) of the demodulated signals (I-ch5, Q-ch5) are detected. In the phase error detection step, the phase error (Pd, Pd1) of the demodulated signals (I-ch5, Q-ch5) is detected based on the signal errors (Ei, Eq) and the polarities (Di, Dq) so as to be used in the demodulation step. In the quadrature error detection step, a quadrature error (Qd) is detected using at least the signal errors (Ei, Eq). In the quadrature error elimination step, complex multiplication is executed to the quadrature components (I-ch1, Q-ch1) obtained in the quasi-coherent detection step, based on the quadrature error (Qd) detected in the quadrature error detection step, and thereby the quadrature error in the demodulated signals (I-ch5, Q-ch5) is eliminated.

In accordance with a fifteenth aspect of the present invention, in the fourteenth aspect, the quasi-coherent detection step includes a local oscillation step, a π/2 phase shift step, a first multiplication step, a second multiplication step, a first A/D conversion step and a second A/D conversion step. In the local oscillation step, a local oscillation signal whose frequency is almost the same as that of the carrier of the modulation signal (IF IN) is generated. In the π/2 phase shift step, the phase of the local oscillation signal generated in the local oscillation step is shifted by π/2. In the first multiplication step, the modulation signal (IF IN) is multiplied by the local oscillation signal generated in the local oscillation step. In the second multiplication step, the modulation signal (IF IN) is multiplied by the π/2-shifted local oscillation signal obtained in the π/2 phase shift step. In the first A/D conversion step, A/D conversion is executed to the signal obtained in the first multiplication step, and thereby the first quadrature component (I-ch1) is obtained. In the second A/D conversion step, A/D conversion is executed to the signal obtained in the second multiplication step, and thereby the second quadrature component (Q-ch1) is obtained.

In accordance with a sixteenth aspect of the present invention, in the fourteenth aspect, the demodulation step includes a first AGC (Automatic Gain Control) step, a complex multiplication step and a second AGC step. In the first AGC step, the amplitude difference between the signals (I-ch2, Q-ch2) obtained in the quadrature error elimination step is corrected and thereby signals (I-ch3, Q-ch3) in which the amplitude difference has been eliminated are obtained. In the complex multiplication step, phase rotation is executed to the signals (I-ch3, Q-ch3) obtained in the first AGC step using phase rotation signals (Sin, Cos) which are generated based on the phase error (Pd, Pd1) detected in the phase error detection step, and thereby signals (I-ch4, Q-ch4) in which the frequency offset components and the phase offset components have been eliminated are obtained. In the second AGC step, the amplitudes of the signals (I-ch4, Q-ch4) obtained in the complex multiplication step are adjusted so that a corresponding signal point will be on a normal signal point, and thereby the demodulated signals (I-ch5, Q-ch5) are obtained.

In accordance with a seventeenth aspect of the present invention, in the sixteenth aspect, the demodulation method further comprises an amplitude error detection step. In the amplitude error detection step, the amplitude error (Ad) of the demodulated signals (I-ch5, Q-ch5) is detected based on the signal errors (Ei, Eq) and the polarities (Di, Dq) so as to be used in the second AGC step.

In accordance with an eighteenth aspect of the present invention, in the seventeenth aspect, the amplitude error (Ad) is detected in the amplitude error detection step by calculating Ei·Di or Eq·Dq.

In accordance with a nineteenth aspect of the present invention, in the signal error detection step of the fourteenth aspect, the signal errors (Ei, Eq) are detected by detecting errors of the demodulated signals (I-ch5, Q-ch5) in comparison with the i-coordinate and the q-coordinate of a normal signal point, and the polarities (Di, Dq) of the demodulated signals (I-ch5, Q-ch5) are detected by detecting the sign bits of the emodulated signals (I-ch5, Q-ch5).

In accordance with a twentieth aspect of the present invention, in the fourteenth aspect, the phase error (Pd, Pd1) is detected in the phase error detection step by calculating Eq·Di-Ei·Dq.

In accordance with a twenty-first aspect of the present invention, in the fourteenth aspect, the quadrature error detection step includes a quadrature error calculation step and a polarity switching step. In the quadrature error calculation step, a quadrature error (Qd') is obtained by calculating Ei·Dq+Eq·Di. In the polarity switching step, it is judged whether or not the signal point of the signals (I-ch3, Q-ch3) in the I-Q complex plane before phase rotation executed in the demodulation step existed in a quadrant adjacent to a quadrant where the signal point of the demodulated signals (I-ch5, Q-ch5) after the phase rotation exists, based on the demodulated signals (I-ch5, Q-ch5) and a phase rotation angle signal (Ang) which is generated from the phase error (Pd, Pd1) detected in the phase error detection step. If the signal point of the signals (I-ch3, Q-ch3) before the phase rotation existed in an adjacent quadrant, the polarity of the quadrature error (Qd') is inverted and the inverted quadrature error is regarded as the quadrature error (Qd). If the signal point of the signals (I-ch3, Q-ch3) before the phase rotation did not exist in an adjacent quadrant, the quadrature error (Qd') is regarded as the quadrature error (Qd).

In accordance with a twenty-second aspect of the present invention, in the fourteenth aspect, the demodulation method further comprises a diagonal line detection step. In the diagonal line detection step, it is judged whether or not each signal point of the demodulated signals (I-ch5, Q-ch5) is a diagonal signal point. The quadrature error (Qd) is detected in the quadrature error detection step based on the signal errors (Ei, Eq), the polarities (Di, Dq), the result of the diagonal line detection step, and a phase rotation angle signal (Ang) which is generated from the phase error (Pd) detected in the phase error detection step.

In accordance with a twenty-third aspect of the present invention, in the twenty-second aspect, the quadrature error detection step includes a quadrature error calculation step, a polarity switching step and a quadrature error switching step. In the quadrature error calculation step, a quadrature error (Qd') is obtained by calculating Ei·Dq+Eq·Di. In the polarity switching step, it is judged whether or not the signal point of the signals (I-ch3, Q-ch3) in the I-Q complex plane before phase rotation executed in the demodulation step existed in a quadrant adjacent to a quadrant where the signal point of the demodulated signals (I-ch5, Q-ch5) after the phase rotation exists, based on the phase rotation angle signal (Ang). If the signal point of the signals (I-ch3, Q-ch3) before the phase rotation existed in an adjacent quadrant, the polarity of the quadrature error (Qd') is inverted and the inverted quadrature error is regarded as the quadrature error (Qd). If the signal point of the signals (I-ch3, Q-ch3) before the phase rotation did not exist in an adjacent quadrant, the quadrature error (Qd') is regarded as the quadrature error (Qd). In the quadrature error switching step, the quadrature error (Qd) to be used in the quadrature error elimination step is switched between 0 and the result of the polarity switching step depending on the result of the diagonal line detection step.

In accordance with a twenty-fourth aspect of the present invention, in the fourteenth aspect, the quadrature error detection step includes a quadrature error calculation step and a polarity switching step. In the quadrature error calculation step, a quadrature error (Qd') is obtained by calculating Ei·Dq+Eq·Di. In the polarity switching step, it is judged whether or not the signal point of the signals (I-ch3, Q-ch3) in the I-Q complex plane before phase rotation executed in the demodulation step existed in a quadrant adjacent to a quadrant where the signal point of the demodulated signals (I-ch5, Q-ch5) after the phase rotation exists, based on a phase rotation angle signal (Ang) which is generated from the phase error (Pd, Pd1) detected by the phase error detection means (12, 21). If the signal point of the signals (I-ch3, Q-ch3) before the phase rotation existed in an adjacent quadrant, the polarity of the quadrature error (Qd') is inverted and the inverted quadrature error is regarded as the quadrature error (Qd). If the signal point of the signals (I-ch3, Q-ch3) before the phase rotation did not exist in an adjacent quadrant, the quadrature error (Qd') is regarded as the quadrature error (Qd).

In accordance with a twenty-fifth aspect of the present invention, in the fourteenth aspect, the quadrature error detection step includes a reverse phase rotation step and a quadrature error calculation step. In the reverse phase rotation step, phase rotation is executed to the signal errors (Ei, Eq) in reverse direction in comparison with the phase rotation executed in the demodulation step, using phase rotation signals (Sin, Cos) which are generated based on the phase error (Pd1) detected in the phase error detection step, and thereby signal errors (Ei', Eq') before the phase rotation are obtained. In the quadrature error calculation step, the quadrature error (Qd) is obtained based on the signal errors (Ei', Eq') before the phase rotation and polarities (Di', Dq') of signals (I-ch2, Q-ch2) before the phase rotation, by calculating Ei'·Dq'+Eq'·Di'.

In accordance with a twenty-sixth aspect of the present invention, in the fourteenth aspect, the quadrature error in the demodulated signal (I-ch5, Q-ch5) is eliminated in the quadrature error elimination step by smoothing the quadrature error (Qd) detected in the quadrature error detection step, multiplying the second quadrature component (Q-ch1) by the smoothed quadrature error (sin δ), and adding the product to the first quadrature component (I-ch1).

BRIEF DESCRIPTION OF THE DRAWINGS

The objects and features of the present invention will become more apparent from the consideration of the following detailed description taken in conjunction with the accompanying drawings, in which:

FIGS. 14 and 15 are graphs showing signal points of demodulated signals in an I-Q complex plane in the case where signals which have been modulated by means of QPSK are demodulated, in which FIG. 14 shows a case where a quadrature error occurred when phase rotation is not executed by the complex multiplier, and FIG. 15 shows a case where a quadrature error occurred when phase rotation is executed by the complex multiplier;

FIG. 16 is a graph showing the positions of signal points of demodulated signals in the I-Q complex plane in the case where a signal which has been modulated by means of 16 QAM is demodulated;

FIG. 18 is a block diagram showing the composition of a quadrature error detector of the demodulator of FIG. 17;

FIG. 20 is a block diagram showing the composition of a quadrature error detector of the demodulator of FIG. 19;

DESCRIPTION OF THE PREFERRED EMBODIMENTS

Figure 1:
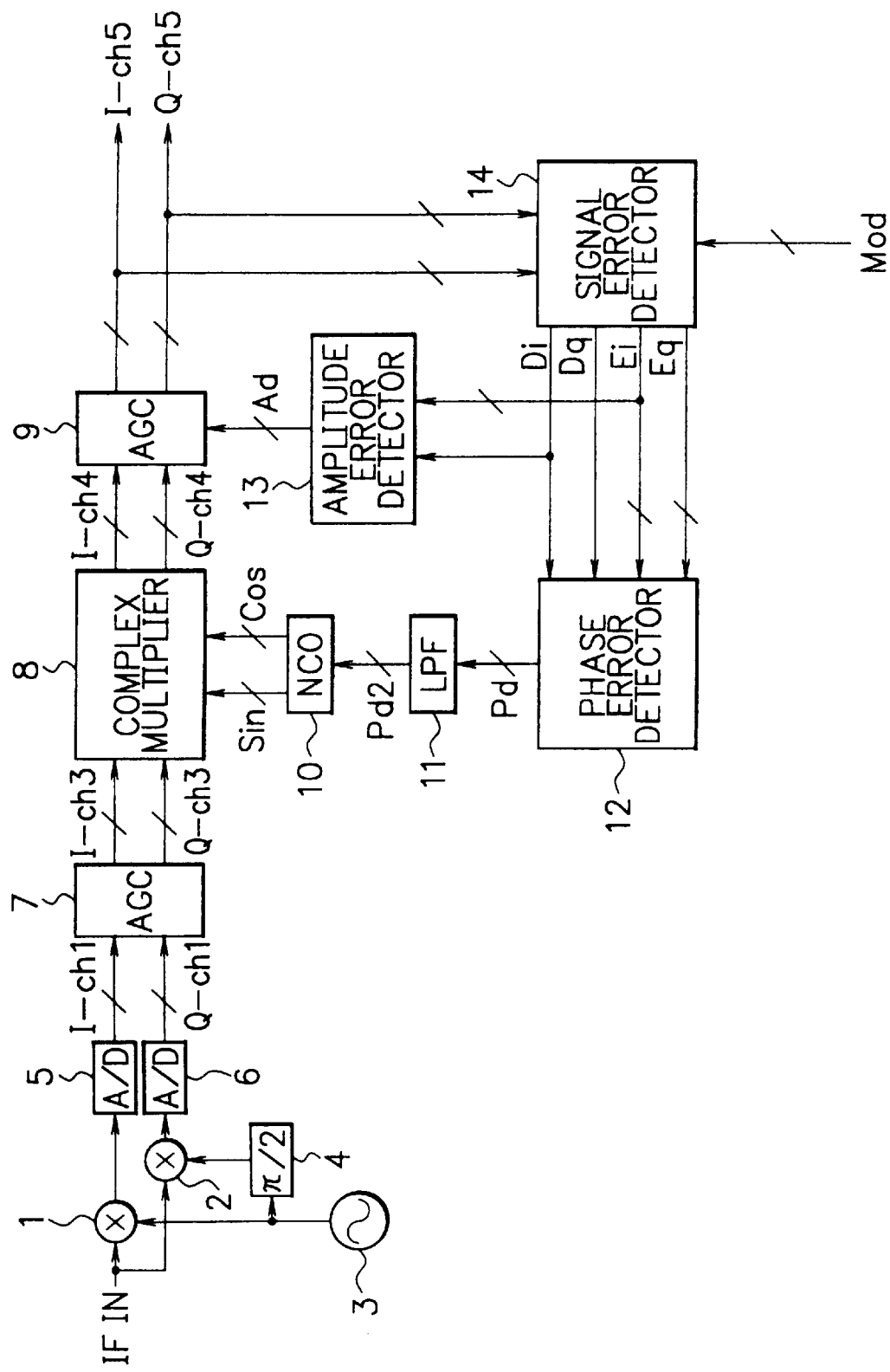
FIG. 1 is a block diagram showing an example of a conventional demodulator.

Referring now to the drawings, a description will be given in detail of preferred embodiments in accordance with the present invention.

Figure 2:
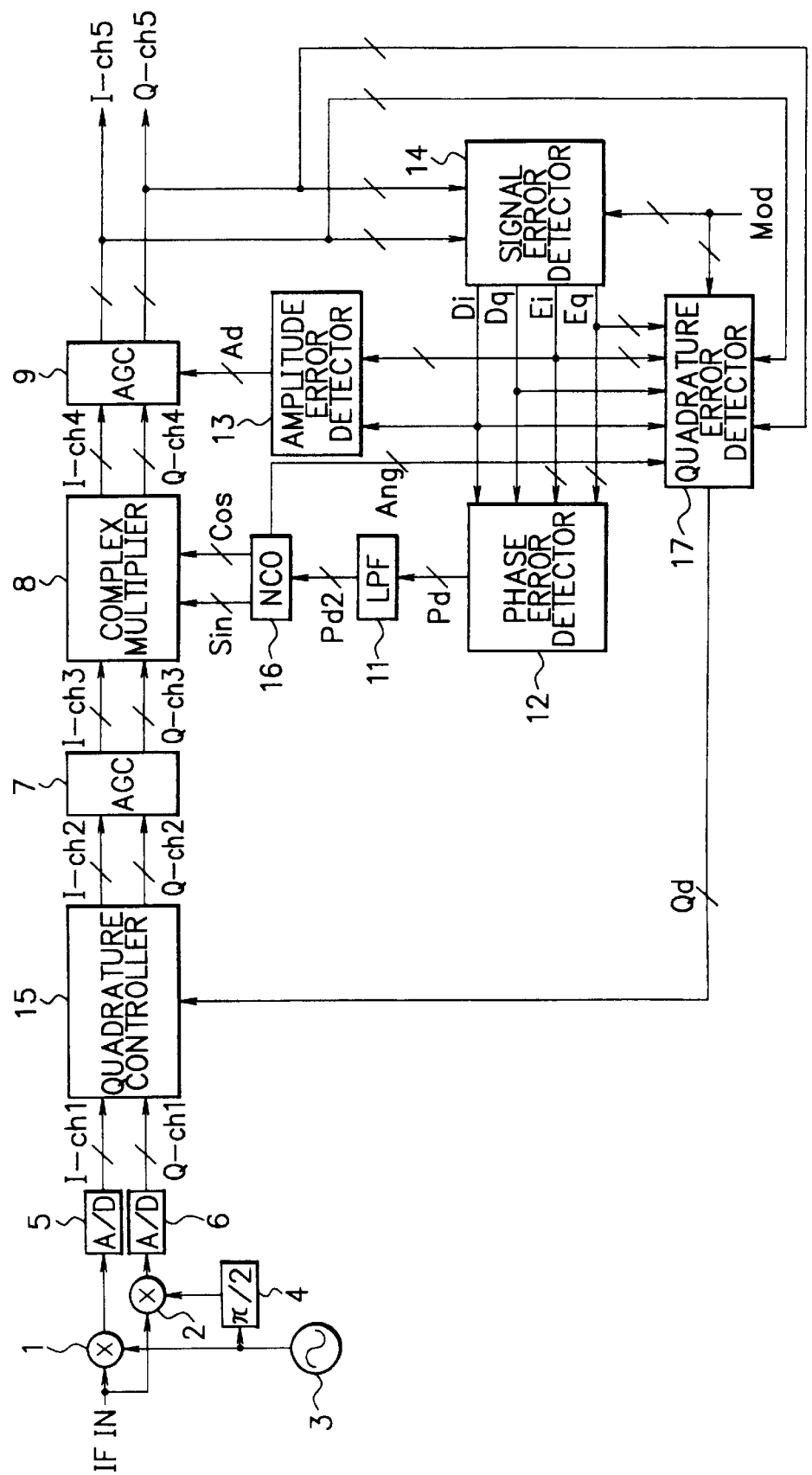
FIG. 2 is a block diagram showing a demodulator in accordance with a first embodiment of the present invention.

FIG. 2 is a block diagram showing a demodulator in accordance with a first embodiment of the present invention.

The demodulator of FIG. 2 comprises multipliers 1 and 2, a local oscillator 3, a π/2 phase shifter 4, A/D converters 5 and 6, AGCs (Automatic Gain Controllers) 7 and 9, a complex multiplier 8, an LPF (LooP Filter) 11, a phase error detector 12, an amplitude error detector 13, a signal error detector 14, a quadrature controller 15, an NCO (Numerical Controlled Oscillator) 16 and a quadrature error detector 17. The components 7~17 of the demodulator of FIG. 2 which are placed after the A/D converters 5 and 6 can be implemented by an LSI.

The demodulator of FIG. 2 is provided with the quadrature controller 15 and the quadrature error detector 17 differently from the conventional demodulator of FIG. 1, and the NCO 16 of the demodulator of FIG. 2 outputs a phase rotation angle signal Ang to the quadrature error detector 17 differently from the NCO 10 of the conventional demodulator of FIG. 1.

Incidentally, the following explanation will be given on the assumption that quasi-coherent detection is employed as the demodulation method of the demodulator of FIG. 2, and the modulation signals which are inputted to the demodulator of FIG. 2 as the IF (Intermediate Frequency) signals are signals which have been modulated by means of quadrature modulation such as PSK (Phase Shift Keying), QAM (Quadrature Amplitude Modulation), etc. In the following explanation, quadrature signal components (channels) of the modulation signal will be referred to as "I-ch" and "Q-ch" according to generally used expressions.

The local oscillator 3 is an oscillator for generating a local oscillation signal whose frequency is almost the same as that of the carrier of the modulation signal (i.e. the IF input signal IF IN). The π/2 phase shifter 4 shifts the phase of the local oscillation signal outputted by the local oscillator 3 by π/2. The multiplier 1 multiplies the IF input signal IF IN by the local oscillation signal outputted by the local oscillator 3, and thereby a first signal component I-ch is obtained. The multiplier 2 multiplies the IF input signal IF IN by the π/2-shifted local oscillation signal outputted by the π/2 phase shifter 4, and thereby a second signal component Q-ch is obtained.

The first signal component I-ch outputted by the multiplier 1 is converted by the A/D converter 5 into a digital signal I-ch1, and the second signal component Q-ch is converted by the A/D converter 6 into a digital signal Q-ch1. The demodulator of FIG. 2 executes quasi-coherent detection, therefore, the digital signals I-ch1 and Q-ch1 are not perfect baseband signals, but include offsets due to frequency difference and phase difference between the carrier frequency and the local oscillation frequency of the local oscillator 3.

The quadrature controller 15, which is supplied with the digital signals I-ch1 and Q-ch1, corrects the digital signals I-ch1 and Q-ch1 using a quadrature error signal Qd supplied from the quadrature error detector 17, and thereby outputs digital signals I-ch2 and Q-ch2 in which the quadrature error has been eliminated.

The AGC 7, which is supplied with the digital signals I-ch2 and Q-ch2, corrects the amplitude difference between the digital signals I-ch2 and Q-ch2, and thereby outputs digital signals I-ch3 and Q-ch3 in which the amplitude difference has been eliminated.

The complex multiplier 8, which is supplied with the digital signals I-ch3 and Q-ch3, corrects the digital signals I-ch3 and Q-ch3 by executing phase rotation using phase rotation signals Sin and Cos supplied from the NCO 16, and thereby outputs digital signals I-ch4 and Q-ch4 in which the effect of the frequency difference between the carrier frequency and the local oscillation frequency of the local oscillator 3 has been eliminated.

The AGC 9 adjusts the amplitudes of the digital signals I-ch4 and Q-ch4 based on an amplitude error signal Ad supplied from the amplitude error detector 13 so that a signal point of demodulated signals I-ch5 and Q-ch5 outputted by the AGC 9 will be on a normal signal point.

The signal error detector 14, which is supplied with the demodulated signals I-ch6 and Q-ch5 from the AGC 9, outputs error signals Ei and Eq and polarity signals Di and Dq. The error signals Ei and Eq outputted by the signal error detector 14 indicate that the error of the signal point of the demodulated signals I-ch5 and Q-ch5 in comparison with a normal signal point is (Ei, Eq). The polarity signals Di and Dq outputted by the signal error detector 14 indicate sign bits (sign binary digits) of the demodulated signals I-ch5 and Q-ch5.

The amplitude error detector 13, which is supplied with the error signal Ei (or Eq) and the polarity signal Di (or Dq) from the signal error detector 14, detects amplitude error of the demodulated signals I-ch5 and Q-ch5 and outputs the amplitude error signal Ad.

The phase error detector 12, which is supplied with the error signals Ei and Eq and the polarity signals Di and Dq from the signal error detector 14, detects phase error of the demodulated signals I-ch5 and Q-ch5 and outputs a phase error signal Pd. The phase error signal Pd outputted by the phase error detector 12 is smoothed by the LPF 11 and the smoothed phase error signal Pd2 is supplied to the NCO 16.

The NCO 16 generates the phase rotation angle signal Ang and the phase rotation signals Sin and Cos using the smoothed phase error signal Pd2 supplied from the LPF 11. The phase rotation angle signal Ang is supplied to the quadrature error detector 17, and the phase rotation signals Sin and Cos are supplied to the complex multiplier 8.

The quadrature error detector 17 detects the quadrature error as will be described later and supplies the quadrature error signal Qd to the quadrature controller 15.

In the following, the compositions and functions of the components of the demodulator of FIG. 2 will be explained in detail referring to figures.

Figure 3:
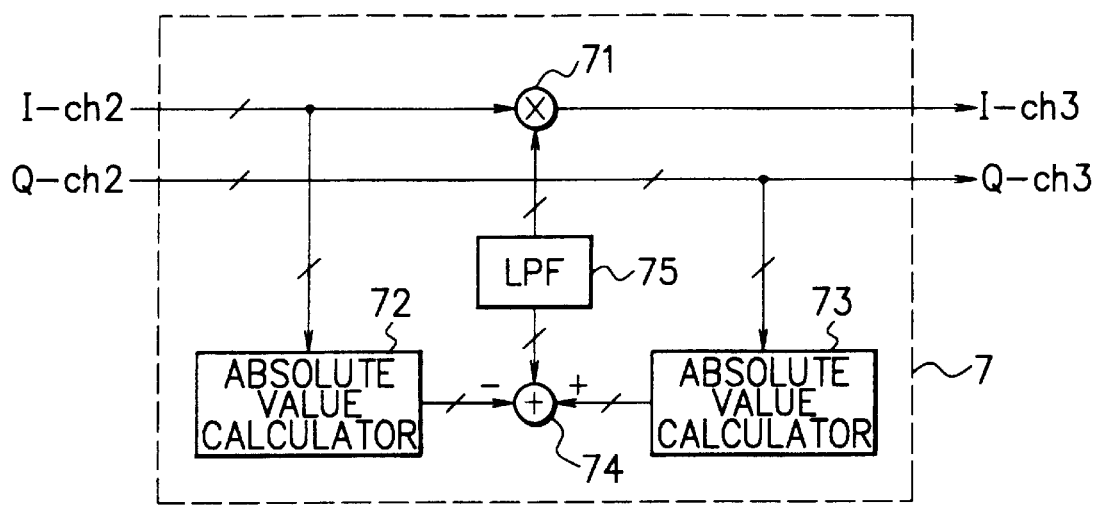
FIG. 3 is a block diagram showing an example of the composition of a first AGC (Automatic Gain Controller) of the demodulator of FIG. 2.

FIG. 3 is a block diagram showing an example of the composition of the AGC 7. The AGC 7 shown in FIG. 3 is composed of a multiplier 71, absolute value calculators 72 and 73, an adder (subtracter) 74, and an LPF 75. In the AGC 7, the amplitude of the digital signal I-ch1 obtained by the absolute value calculator 72 is compared by the adder 74 (as a subtracter) with that of the digital signal Q-ch1 obtained by the absolute value calculator 73, and thereby the amplitude of the digital signal I-ch1 is adjusted to that of the digital signal Q-ch1.

Figure 4:
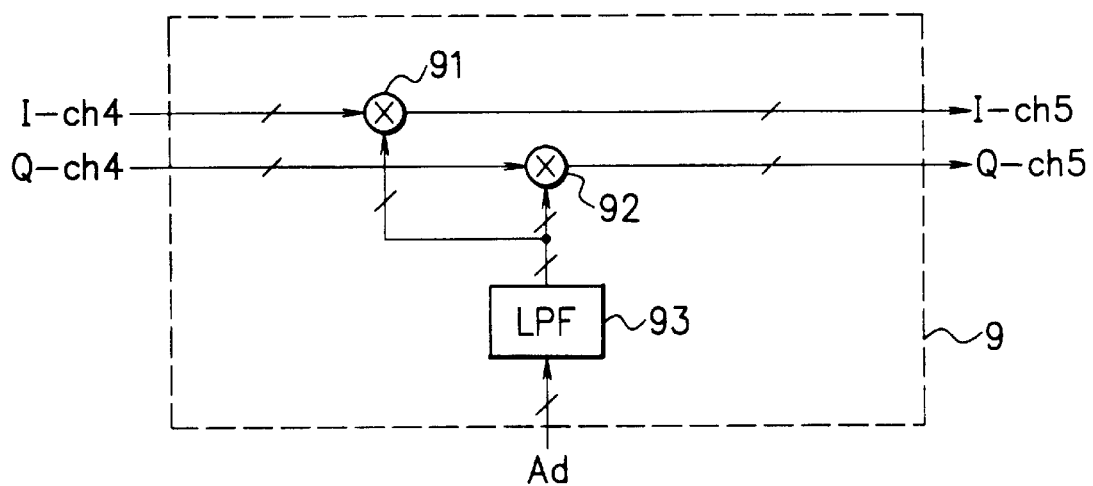
FIG. 4 is a block diagram showing an example of the composition of a second AGC of the demodulator of FIG. 2.

FIG. 4 is a block diagram showing an example of the composition of the AGC 9. The AGC 9 shown in FIG. 4 is composed of multipliers 91 and 92 and an LPF 93. By the AGC 9 which is supplied with the amplitude error signal Ad from the amplitude error detector 13, the amplitudes of the digital signals I-ch4 and Q-ch4 are adjusted so that the signal point of the modulated signals I-ch5 and Q-ch5 outputted by the AGC 9 will be on a normal signal point.

Figure 5:
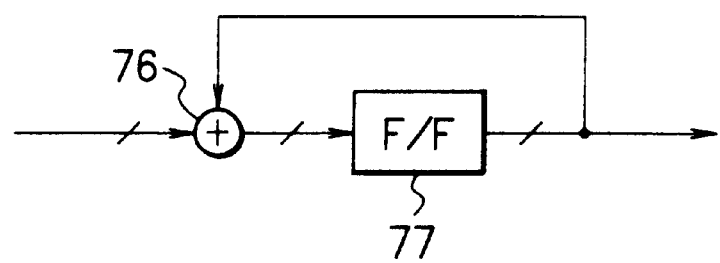
FIG. 5 is a block diagram showing an example of the composition of a lowpass filter included in the first AGC or the second AGC.

FIG. 5 is a block diagram showing an example of the composition of the LPF 75 included in the AGC 7 (or the LPF 93 included in the AGC 9). Such an LPF (LowPass Filter) can be implemented by an integrator composed of a F/F (flip-flop) 77 and an adder 76.

Figure 6:
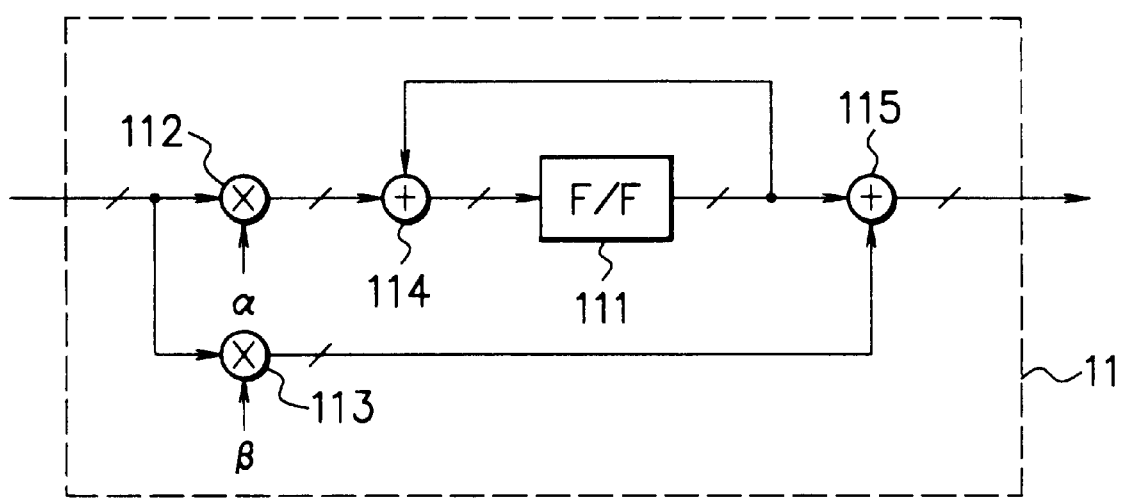
FIG. 6 is a block diagram showing an example of the composition of an LPF (LooP Filter) of the demodulator of FIG. 2.

FIG. 6 is a block diagram showing an example of the composition of the LPF 11. The LPF 11 shown in FIG. 6 is a typical second order lag-lead filter which is composed of a F/F (flip-flop) 111, multipliers 112 and 113, and adders 114 and 115. Generally, a frequency offset has to be eliminated in a carrier regeneration loop composed of a complex multiplier, a phase detector, an LPF and an NCO, therefore, the LPF 11 has to be a second order filter or higher.

Figure 7:
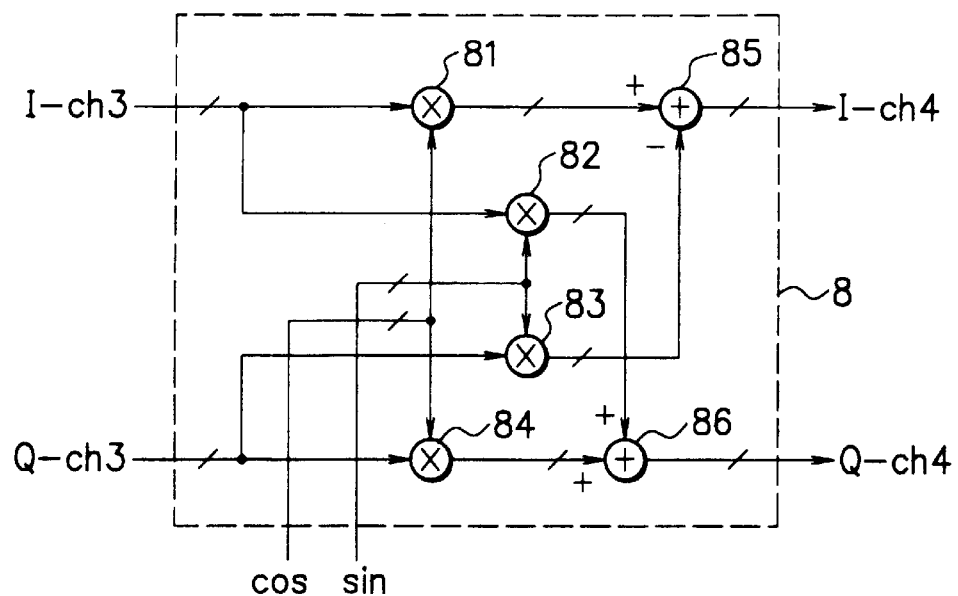
FIG. 7 is a block diagram showing an example of the composition of a complex multiplier of the demodulator of FIG. 2.

FIG. 7 is a block diagram showing an example of the composition of the complex multiplier 8. The complex multiplier 8 shown in FIG. 7 is composed of multipliers 81~84 and adders 85 and 86. By the composition shown in FIG. 7, phase rotation is executed to the digital signals I-ch3 and Q-ch3 as follows:

$$I\text{-}ch4 = I\text{-}ch3 \cdot Cos - Q\text{-}ch3 \cdot Sin$$

$$Q\text{-}ch4 = I\text{-}ch3 \cdot Sin + Q\text{-}ch3 \cdot Cos,$$

and thereby frequency offset components and phase offset components included in the digital signals I-ch3 and Q-ch3 are eliminated.

Figure 8:
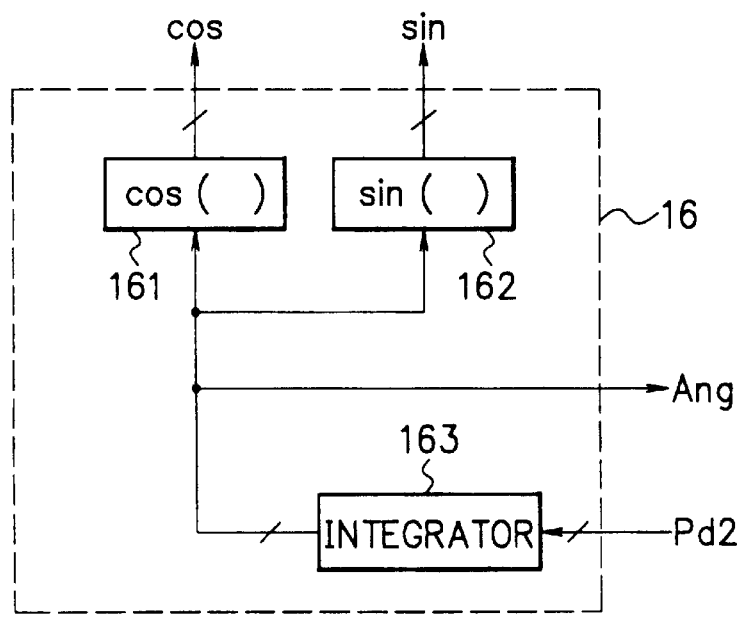
FIG. 8 is a block diagram showing an example of the composition of an NCO (Numerical Controlled Oscillator) of the demodulator of FIG. 2.

FIG. 8 is a block diagram showing an example of the composition of the NCO 16. The NCO 16 shown in FIG. 8 is composed of a cosine calculator 161, a sine calculator 162 and an integrator 163. The integrator 163 integrates the phase error signal Pd2 which has been smoothed by the LPF 11, and thereby the phase rotation angle signal Ang is obtained. The cosine calculator 161 and the sine calculator 162 calculate cos (Ang) and sin (Ang), and outputs phase rotation signals Sin and Cos respectively.

Figure 9:
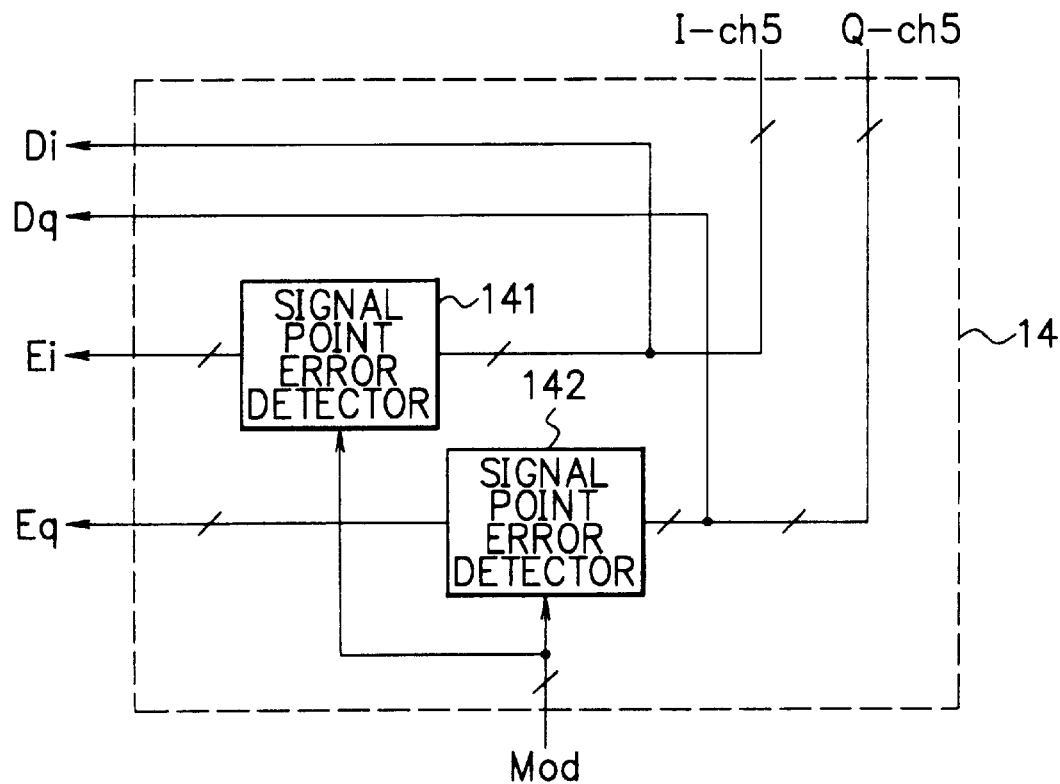
FIG. 9 is a block diagram showing an example of the composition of a signal error detector of the demodulator of FIG. 2.

FIG. 9 is a block diagram showing an example of the composition of the signal error detector 14. The signal error detector 14 shown in FIG. 9 is composed of a signal point error detectors 141 and 142. The signal point error detector 141 detects the error of the demodulated signal I-ch5 in comparison with the i-component of the position vector of a normal signal point (i.e. in comparison with the i-coordinate of the normal signal point) and thereby outputs an error signal Ei. The signal point error detector 142 detects the error of the demodulated signal Q-ch5 in comparison with the q-component of the position vector of the normal signal point (i.e. in comparison with the q-coordinate of the normal signal. point) and thereby outputs an error signal Eq. The error signals Ei and Eq outputted by the signal point error detectors 141 and 142 indicate that the error of the signal point of the demodulated signals I-ch5 and Q-ch5 in comparison with the normal signal point is (Ei, Eq). The position of the normal signal point is switched depending on a modulation method which is employed (depending on a modulation method designation signal Mod supplied thereto). Sign bits (sign binary digits) of the demodulated signals I-ch5 and Q-ch5 are extracted and outputted as the polarity signals Di and Dq respectively.

Figure 10:
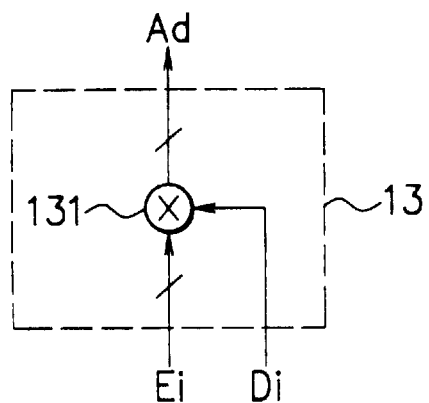
FIG. 10 is a block diagram showing an example of the composition of an amplitude error detector of the demodulator of FIG. 2.

FIG. 10 is a block diagram showing an example of the composition of the amplitude error detector 13. The amplitude error detector 13 shown in FIG. 10 is composed of a multiplier 131. The amplitude error signal Ad is obtained by multiplying the error signal Ei by the polarity signal Di or by multiplying the error signal Eq by the polarity signal Dq. In the example of FIG. 10, the amplitude error signal Ad is obtained by Ei·Di.

Figure 11:
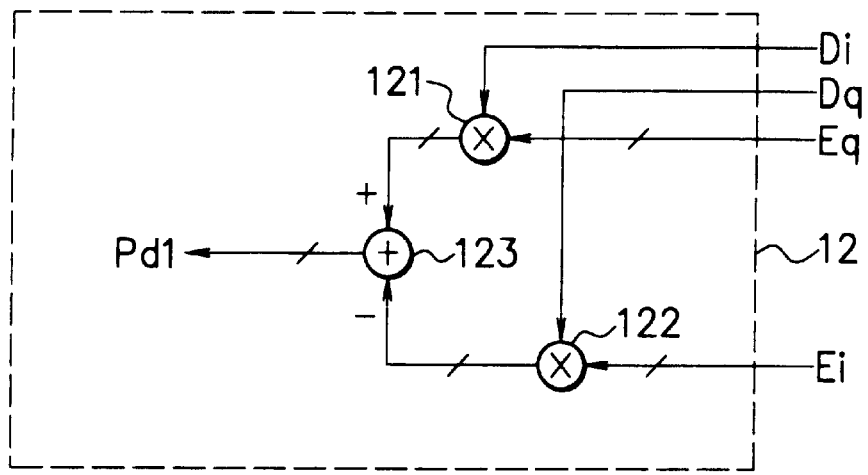
FIG. 11 is a block diagram showing an example of the composition of a phase error detector of the demodulator of FIG. 2.

FIG. 11 is a block diagram showing an example of the composition of the phase error detector 12. The phase error detector 12 shown in FIG. 11 is composed of multipliers 121 and 122 and an adder 123. The multiplier 121 multiplies the error signal Eq by the polarity signal Di, and the multiplier 122 multiplies the error signal Ei by the polarity signal Dq.

The adder 123 subtracts (Ei·Dq) from (Eq·Di), and thereby the phase error signal Pd (=Eq·Di·Ei·Dq) is obtained.

Figure 12:
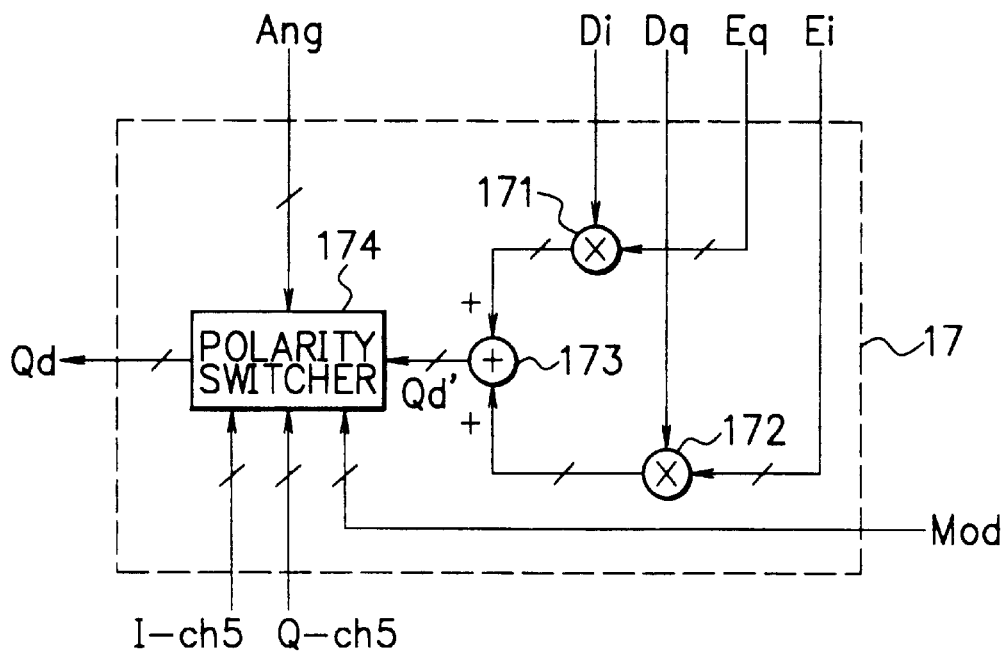
FIG. 12 is a block diagram showing an example of the composition of a quadrature error detector of the demodulator of FIG. 2.

FIG. 12 is a block diagram showing an example of the composition of the quadrature error detector 17. The quadrature error detector 17 shown in FIG. 12 is composed of multipliers 171 and 172, an adder 173 and a polarity switcher 174. The quadrature error detector 17 figures out the quadrature error as will be explained later and supplies the quadrature error signal Qd to the quadrature controller 15.

Figure 13:
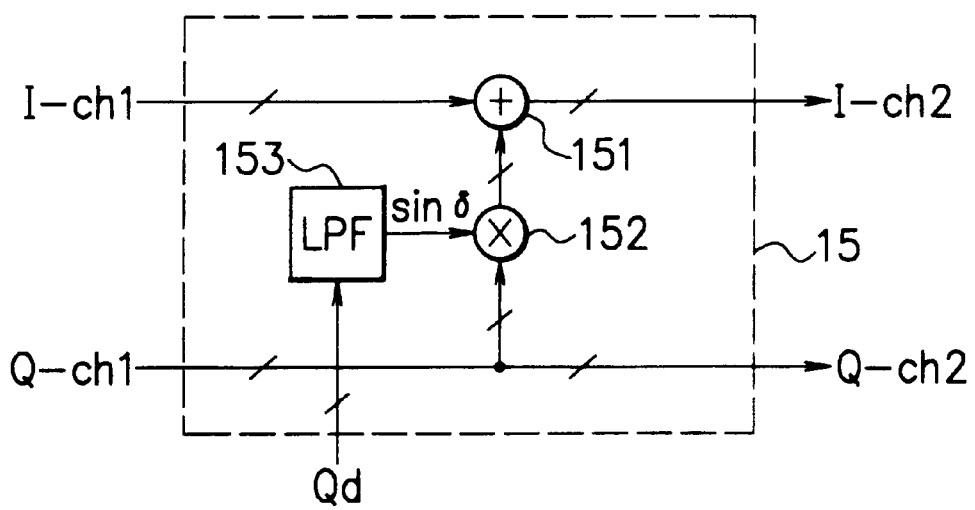
FIG. 13 is a block diagram showing an example of the composition of a quadrature controller of the demodulator of FIG. 2.

FIG. 13 is a block diagram showing an example of the composition of the quadrature controller 15. The quadrature controller 15 shown in FIG. 13 is composed of an adder 151, a multiplier 152 and an LPF 153. The quadrature error signal Qd from the quadrature error detector 17 which has been smoothed by the LPF 153 is multiplied by the digital signal Q-ch1 by the multiplier 152. The output of the multiplier 152 is added to the digital signal I-ch1, and thereby the quadrature error is eliminated.

In the following, the operation of the demodulator of the first embodiment will be described in detail, mainly on the operations of the quadrature error detector 17 and the quadrature controller 15.

As can be seen in FIG. 2, the (signal point position) error signals Ei and Eq and the polarity signals Di and Dq (which are used by the quadrature error detector 17 for detecting the quadrature error) are obtained by the signal error detector 14 based on the demodulated signals I-ch5 and Q-ch5 after phase rotation by the complex multiplier 8, while the quadrature control (quadrature error correction) by the quadrature controller 15 is executed before the phase rotation by the complex multiplier 8. Therefore, the quadrature error before the phase rotation have to be estimated from the (signal point position) error signals Ei and Eq after the phase rotation.

Figure 14:
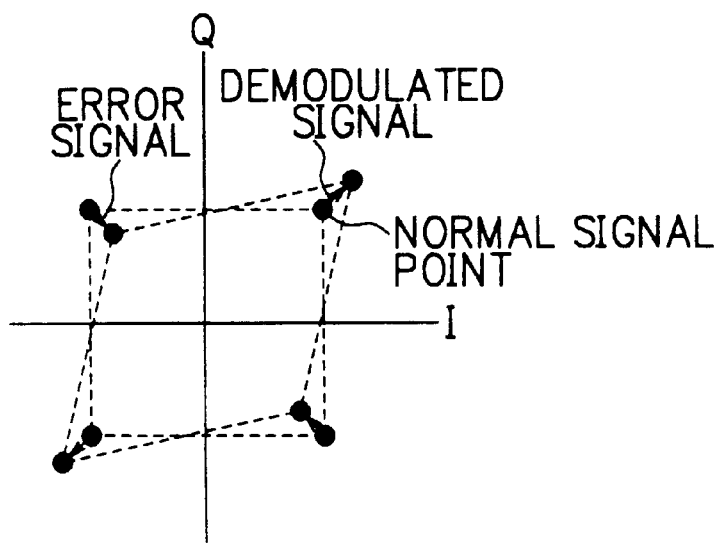

FIGS. 14 and 15 are graphs showing signal points of the demodulated signals I-ch5 and Q-ch5 in an I-Q complex plane, in the case where signals which have been modulated by means of QPSK are demodulated. FIG. 14 shows the signal points of the demodulated signals I-ch5 and Q-ch5 in the case where the carrier frequency is completely equal to the local oscillation frequency (that is, in the case where a quadrature error occurred when no phase rotation is executed by the complex multiplier 8), and FIG. 15 shows the signal points of the demodulated signals I-ch5 and Q-ch5 in the case where the carrier frequency is not completely equal to the local oscillation frequency (that is, in the case where a quadrature error occurred when phase rotation is executed by the complex multiplier 8).

Normally, the four signal points should form a square since the distance of the four signal points from the origin should be the same, however, the four signal points in FIG. 14 form a rhombus due to the quadrature error.

In the case of FIG. 15 where the phase rotation is executed by the complex multiplier 8, each signal point is located on a circle around each normal signal point.

Such statuses shown in FIGS. 14 and 15 can be corrected based on a quadrature error signal which is obtained as follows:

$$Qd' = Ei \cdot Dq + Eq \cdot Di \quad (1).$$

The above quadrature error signal indicates a scalar quantity concerning the error (outward shift) of the signal point of the demodulated signals I-ch5 and Q-ch5 from the normal signal point in a direction parallel to a diagonal line of the rhombus. The above quadrature error signal Qd' is information after the phase rotation by the complex multiplier 8, therefore, a quadrature error signal Qd before the phase rotation has to be estimated from the quadrature error signal Qd'. The estimation is executed by the quadrature error detector 17 as described below.

Referring to FIG. 14, the quadrature error signals Qd' for the first quadrant (the upper right quadrant) and the third quadrant (the lower left quadrant) are signals indicating errors in directions from the origin toward the signal points (outward errors), and the quadrature error signals Qd' for the second quadrant (the upper left quadrant) and the fourth quadrant (the lower right quadrant) are signals indicating errors in directions from the signal points toward the origin (inward errors). The absolute values of the errors are all the same. The quadrature error signals Qd' for adjacent quadrants have the same absolute value and opposite polarity.

FIG. 16 is a graph showing the positions of signal points of the demodulated signals I-ch5 and Q-ch5 in the I-Q complex plane, in the case where a signal which has been modulated by means of 16 QAM is demodulated. Referring to FIG. 16, with regard to signal points on diagonal lines of the square formed by the outermost signal points (i.e. with regard to diagonal signal points), the angle between the signal point and the adjacent quadrant is θ1 (=π/4), and the angle is θ2 (=arctan(3)) or π/2-θ2 for other signal points (non-diagonal signal points). Therefore, the angle between a signal point and an adjacent quadrant varies depending on the signal point.

In the quadrature error detector 17 which has been shown in FIG. 12, the polarity switcher 174 judges whether or not the signal point of digital signals I-ch3 and Q-ch3 in the I-Q complex plane before the phase rotation existed in a quadrant adjacent to a quadrant where the signal point of the modulated signals I-ch5 and Q-ch5 after the phase rotation exists, based on the modulated signals I-ch5 and Q-ch5 after the phase rotation, the phase rotation angle signal Ang and the modulation method designation signal Mod. If the signal point of digital signals I-ch3 and Q-ch3 existed in an adjacent quadrant, the polarity switcher 174 inverts the polarity of the quadrature error signal Qd' and the inverted signal is outputted from the quadrature error detector 17 as the quadrature error signal Qd. If the signal point of digital signals I-ch3 and Q-ch3 did not exist in an adjacent quadrant, the polarity switcher 174 does not invert the polarity of the quadrature error signal Qd' and the quadrature error signal Qd' is directly outputted from the quadrature error detector 17 as the quadrature error signal Qd.

The quadrature controller 15 executes the quadrature control quadrature error correction) using the quadrature error signal Qd as follows.

If we describe the IF input signal IF IN as A(t), the angular velocity of the local oscillator 3 as ω[rad/s], and the phase shift error of the π/2 phase shifter 4 as δ [rad], the first signal component I-ch which is supplied to the A/D converter 5 and the second signal component Q-ch which is supplied to the A/D converter 6 can be described as:

$$I\text{-}ch = A(t)\cos(\omega t + \delta) \quad (2)$$
$$= A(t)\cos\omega t \cdot \cos\delta - A(t)\sin\omega t \cdot \sin\delta$$
$$= A(t)\cos\omega t \cdot \cos\delta - Q\text{-}ch \cdot \sin\delta$$

$$Q\text{-}ch = A(t)\sin\omega t. \quad (3)$$

In order to demodulate the IF input signal A(t) correctly, the phase shift error δ included in the signal component I-ch has to be removed. The first term A(t) cos ωt·cos δ only changes the gain of the I-channel (i.e. A(t) cos ωt), therefore, correction with respect to the first term can be a executed by the AGC 7 which is placed after the quadrature controller 15.

Therefore, the quadrature controller 15 is only needed to execute correction with respect to the second term:

$$-Q\text{-ch}\cdot\sin\delta \qquad (4).$$

The phase shift error δ can be regarded as a constant in the short term, therefore, the quadrature controller 15 can execute the correction of the quadrature error by multiplying the second signal component Q-ch (Q-ch1) by sin δ, and adding the product to the first signal component I-ch (I-ch1). Referring to FIG. 13, the LPF 153 smoothes the quadrature error signal Qd and thereby outputs sin δ. The multiplier 152 multiplies the digital signal Q-ch1 by sin 6, and the adder 151 adds Q-ch·sin δ to I-ch1, and thereby the effect of the phase shift error δ of the π/2 phase shifter 4 (i.e. the quadrature error) is eliminated.

As described above, by the demodulator in accordance with the first embodiment of the present invention, quadrature error due to the phase shift error of the π/2 phase shifter 4 can be corrected and eliminated automatically by means of digital signal processing, with no need of manual control. Therefore, deterioration of demodulation properties (bit error rate etc.) can automatically be prevented for the long term.

Figure 17:
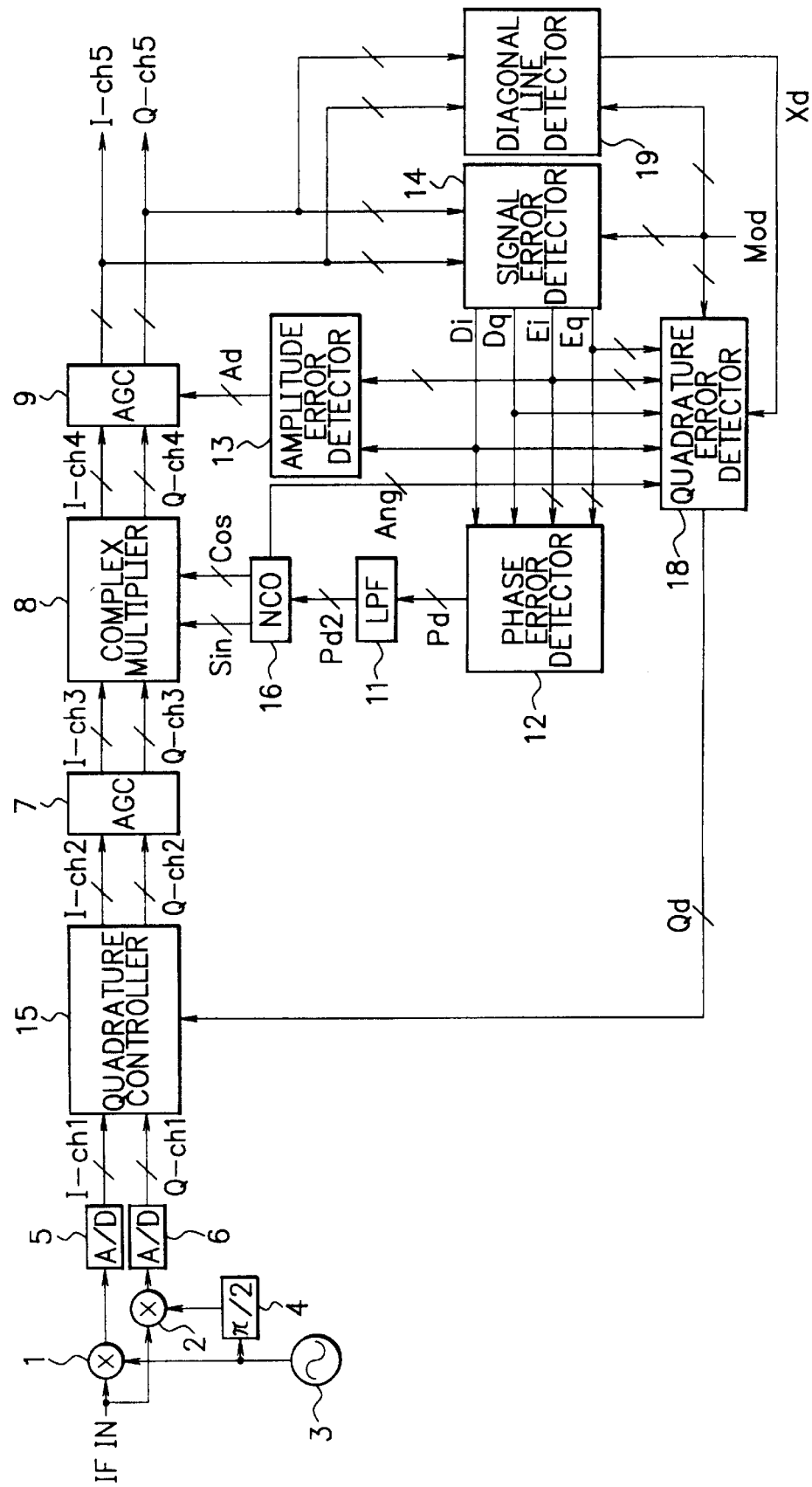
FIG. 17 is a block diagram showing a demodulator in accordance with a second embodiment of the present invention.

FIG. 17 is a block diagram showing a demodulator in accordance with a second embodiment of the present invention. The demodulator of FIG. 17 further comprises a diagonal line detector 19 in comparison with the first embodiment of FIG. 2. The quadrature error detector 18 shown in FIG. 17 operates differently from the quadrature error detector 17 of the first embodiment.

The diagonal line detector 19 judges whether or not each signal point of the demodulated signals I-ch5 and Q-ch5 is a "diagonal signal point" (that is, whether or not each signal point of the demodulated signals I-ch5 and Q-ch5 is approximately located on a diagonal line of a square which is formed by the outermost signal points) based on the demodulated signals I-ch5 and Q-ch5 and the modulation method designation signal Mod, and outputs a diagonal line detection signal Xd.

FIG. 18 is a block diagram showing the composition of the quadrature error detector 18 of the second embodiment. The quadrature error detector 18 shown in FIG. 18 is composed of multipliers 181 and 182, an adder 183, a polarity switcher 184 and an output ON/OFF circuit 185. The quadrature error detector 18 first obtains the quadrature error signal Qd' in the same way as the quadrature error detector 17 of the first embodiment. Thereafter, the polarity switcher 184 of the quadrature error detector 18 executes the polarity switching based on the phase rotation angle signal Ang only. If the diagonal line detection signal Xd indicated that the signal point of the demodulated signals I-ch5 and Q-ch5 is a diagonal signal point, the output ON/OFF circuit 185 outputs the quadrature error signal Qd outputted by the polarity switcher 184. If the diagonal line detection signal Xd indicated that the signal point is not a diagonal signal point, the output ON/OFF circuit 185 outputs "0" as the quadrature error signal Qd.

In the case where the signal point of the demodulated signals I-ch5 and Q-ch5 is a diagonal signal point, the angle between the signal point and an adjacent quadrant is necessarily π/4. Therefore, the judgment (on whether or not the signal point of the digital signals I-ch3 and Q-ch3 before the phase rotation existed in a quadrant adjacent to a quadrant where the signal point of the modulated signals I-ch5 and Q-ch5 after the phase rotation exists) can be executed by the polarity switcher 184 based on part (2 bits or less) of the phase rotation angle signal Ang only. Therefore, the circuit for judgment can be simplified in comparison with the first embodiment.

Figure 19:
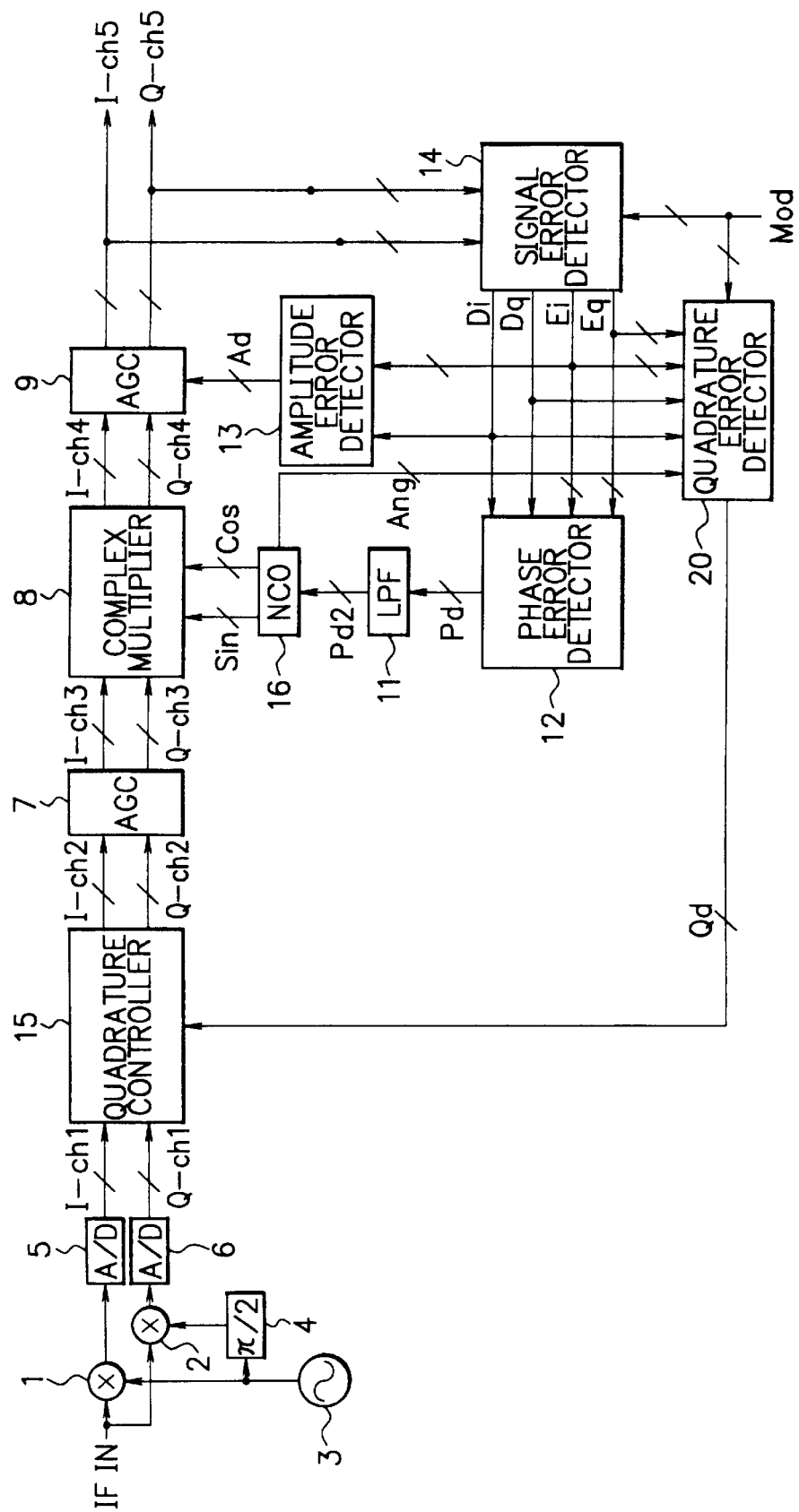
FIG. 19 is a block diagram showing a demodulator in accordance with a third embodiment of the present invention.

FIG. 19 is a block diagram showing a demodulator in accordance with a third embodiment of the present invention. The demodulator of FIG. 19 is not provided with the diagonal line detector 19 of the second embodiment, and the quadrature error detector 20 shown in FIG. 19 is simplified as shown in FIG. 20. The other composition is the same as that of the second embodiment.

FIG. 20 is a block diagram showing the composition of the quadrature error detector 20 of the third embodiment. The polarity switcher 184 of the quadrature error detector 20 executes the judgment (on whether or not the signal point of the digital signals I-ch3 and Q-ch3 before the phase rotation existed in a quadrant adjacent to a quadrant where the signal point of the modulated signals I-ch5 and Q-ch5 after the phase rotation exists) and the polarity switching of the quadrature error signal Qd' based on the phase rotation angle signal Ang only, and thereby obtains a quadrature error signal Qd. The quadrature error detector 20 is not provided with the output ON/OFF circuit 185, therefore, the quadrature error detector 20 always outputs the quadrature error signal Qd.

The quadrature error detector 20 has the simplest circuit composition. The quadrature error signals Qd for non-diagonal signal points are not necessarily correct in polarity, and thus false quadrature control can be executed by the quadrature controller 15. However, the signal points are normally located symmetrically with respect to the diagonal lines, therefore, a steady offset does not occur in the integral of the quadrature error signal Qd even if variations existed. Therefore, the quadrature error detector 20 of the third embodiment can be used without any practical problems by setting a large time constant to the LPF 153 of the quadrature controller 15.

Figure 21:
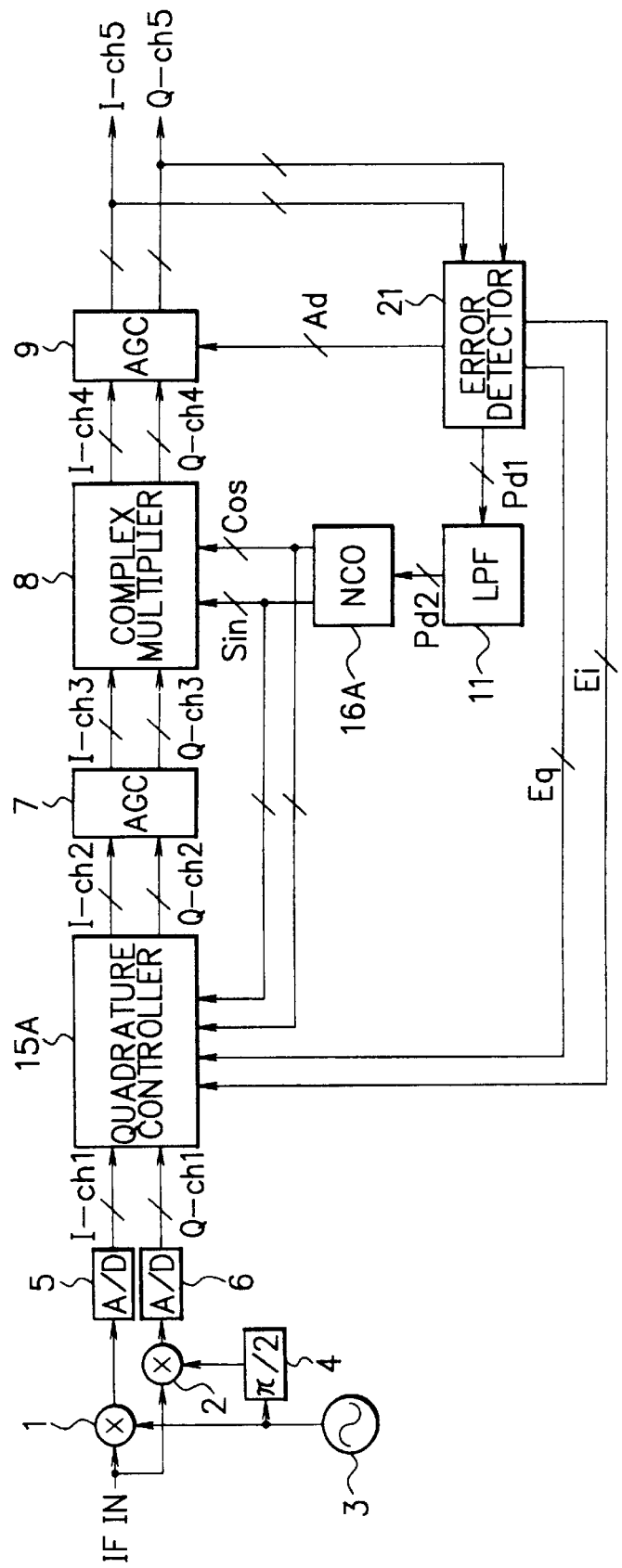
FIG. 21 is a block diagram showing a demodulator in accordance with a fourth embodiment of the present invention.

FIG. 21 is a block diagram showing a demodulator in accordance with a fourth embodiment of the present invention. The demodulator of FIG. 21 is provided with an error detector 21 instead of the signal error detector 14, the phase error detector 12 and the amplitude error detector 13 of the demodulators of the previous embodiments. The quadrature controller 15A shown in FIG. 21 has different composition from the quadrature controller 15 of the demodulators of the previous embodiments. The phase rotation signals Sin and Cos outputted by the NCO 16A shown in FIG. 21 are also supplied to the quadrature controller 15A, differently from the previous embodiments.

Figure 22:
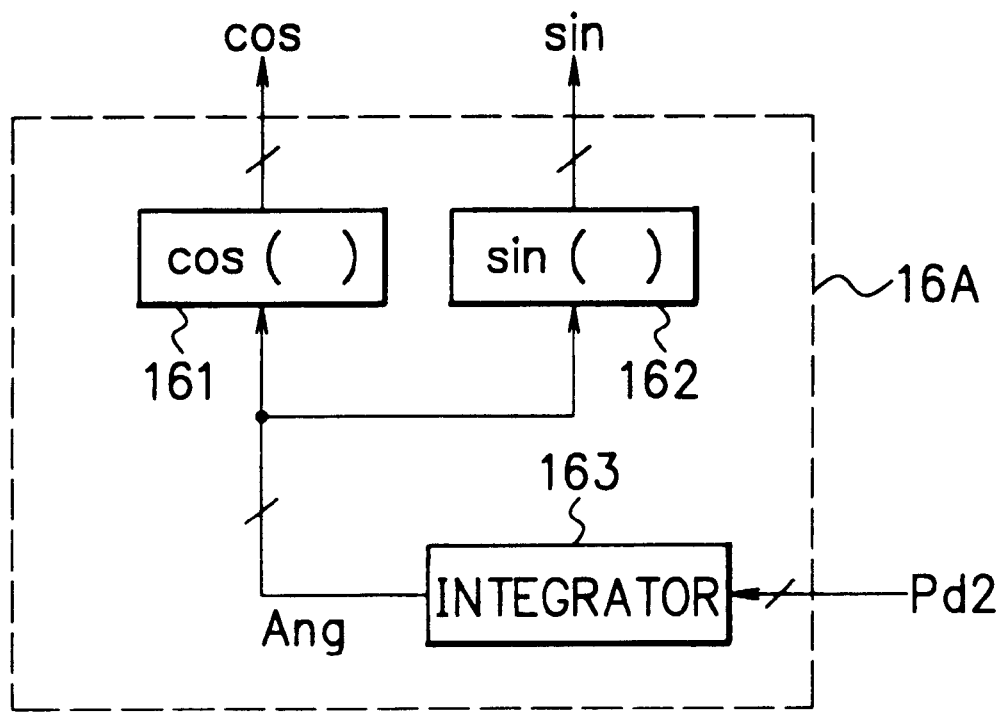
FIG. 22 is a block diagram showing the composition of an NCO of the demodulator of FIG. 21.

FIG. 22 is a block diagram showing the composition of the NCO 16A. The NCO 16A shown in FIG. 22 has the same composition as the NCO 16 of the previous embodiments. The integrator 163 integrates the phase error signal Pd2 which has been smoothed by the LPF 11 and thereby obtains the phase rotation angle signal Ang in the same way as the previous embodiments. However, the phase rotation angle signal Ang obtained by the integrator 163 is not outputted to outside. The cosine calculator 161 and the sine calculator 162 calculate cos (Ang) and sin (Ang), and outputs the phase rotation signals Sin and Cos respectively. The phase rotation signals Sin and Cos are supplied to the quadrature controller 15A, as well as to the complex multiplier 8.

Figure 23:
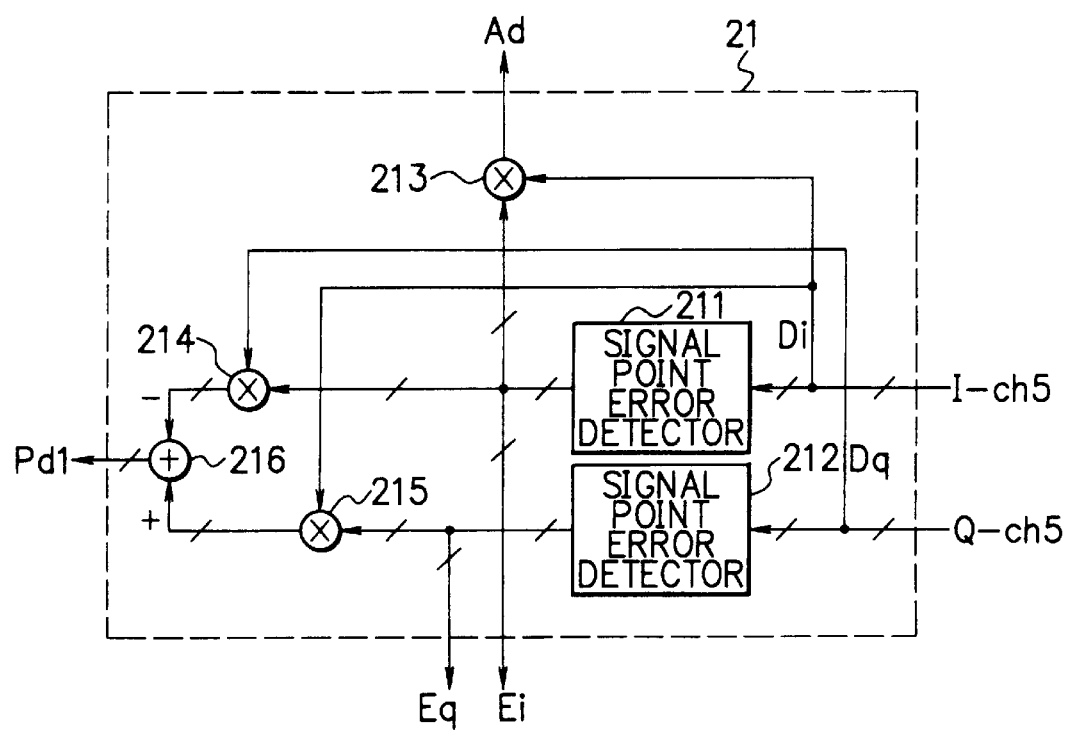
FIG. 23 is a block diagram showing the composition of an error detector of the demodulator of FIG. 21.

FIG. 23 is a block diagram showing the composition of the error detector 21. The error detector 21 includes signal point error detectors 211 and 212, multipliers 213, 214 and 215 and an adder (subtracter) 216. The signal point error detector 211 detects the error of the demodulated signal I-ch5 in comparison with the i-component of the position vector of a normal signal point (i.e. in comparison with the i-coordinate of the normal signal point), and thereby outputs the error signal Ei. The signal point error detector 212 detects the error of the demodulated signal Q-ch5 in comparison with the q-component of the position vector of the normal signal point (i.e. in comparison with the q-coordinate of the normal signal point), and thereby outputs the error signal Eq. The sign bit (sign binary digit) of the demodulated signal I-ch5 is supplied to the multipliers 213 and 215 as the polarity signal Di, and the sign bit of the demodulated signal Q-ch5 is supplied to the multiplier 214 as the polarity signal Dq. The amplitude error signal Ad is obtained by multiplying the error signal Ei by the polarity signal Di or by multiplying the error signal Eq by the polarity signal Dq. In the example of FIG. 23, the amplitude error signal Ad is obtained by the multiplier 213 by Ei·Di. The phase error signal Pd1 (=Eq·Di·Ei·Dq) is obtained by the multipliers 214 and 215 and the adder (subtracter) 216.

Figure 24:
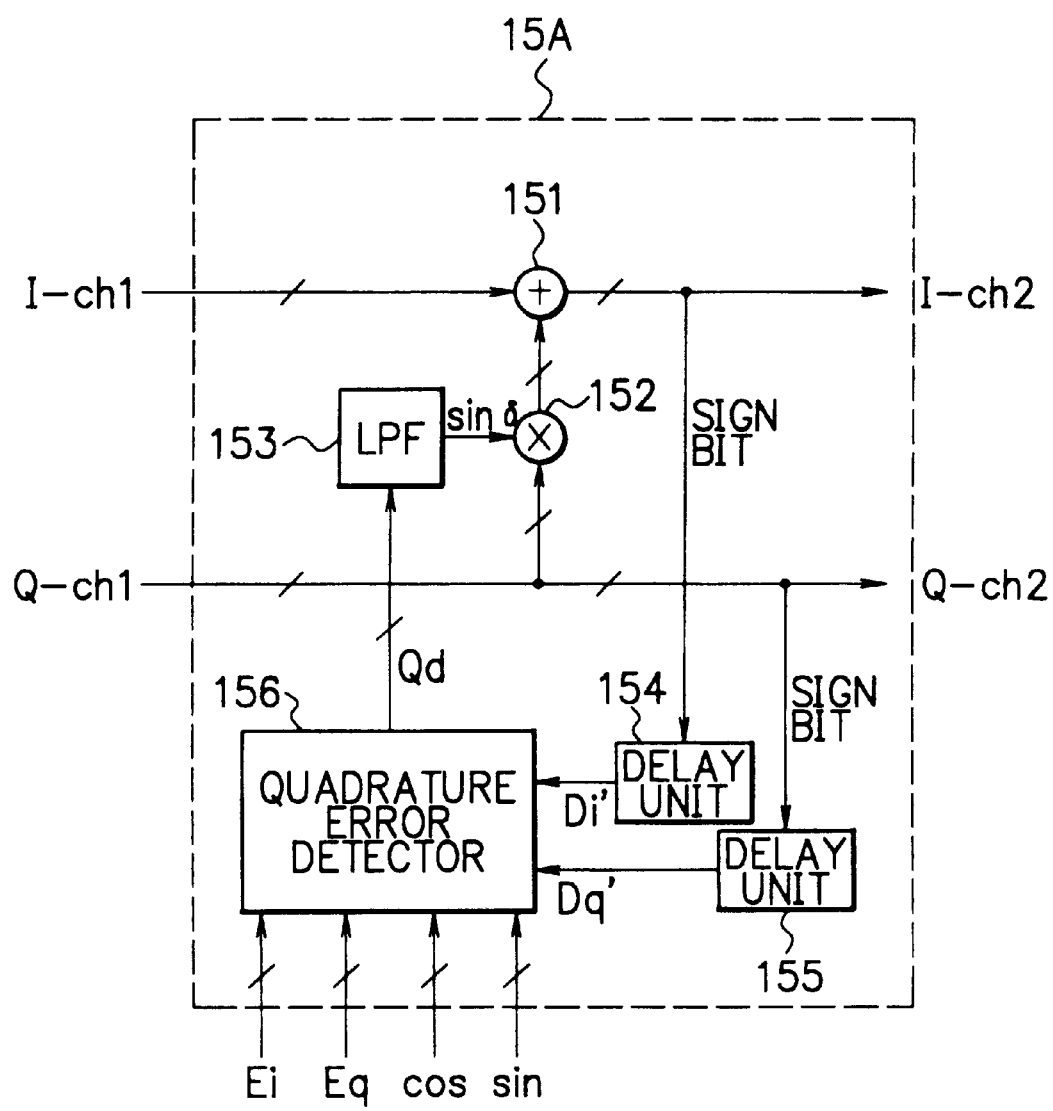
FIG. 24 is a block diagram showing the composition of a quadrature controller of the demodulator of FIG. 21.

FIG. 24 is a block diagram showing the composition of the quadrature controller 15A. The quadrature controller 15A of the fourth embodiment includes the adder 151, the multiplier 152 and the LPF 153 similarly to the quadrature controller 15 of the previous embodiments. The quadrature controller 15A further includes delay units 154 and 155 and a quadrature error detector 156.

Figure 25:
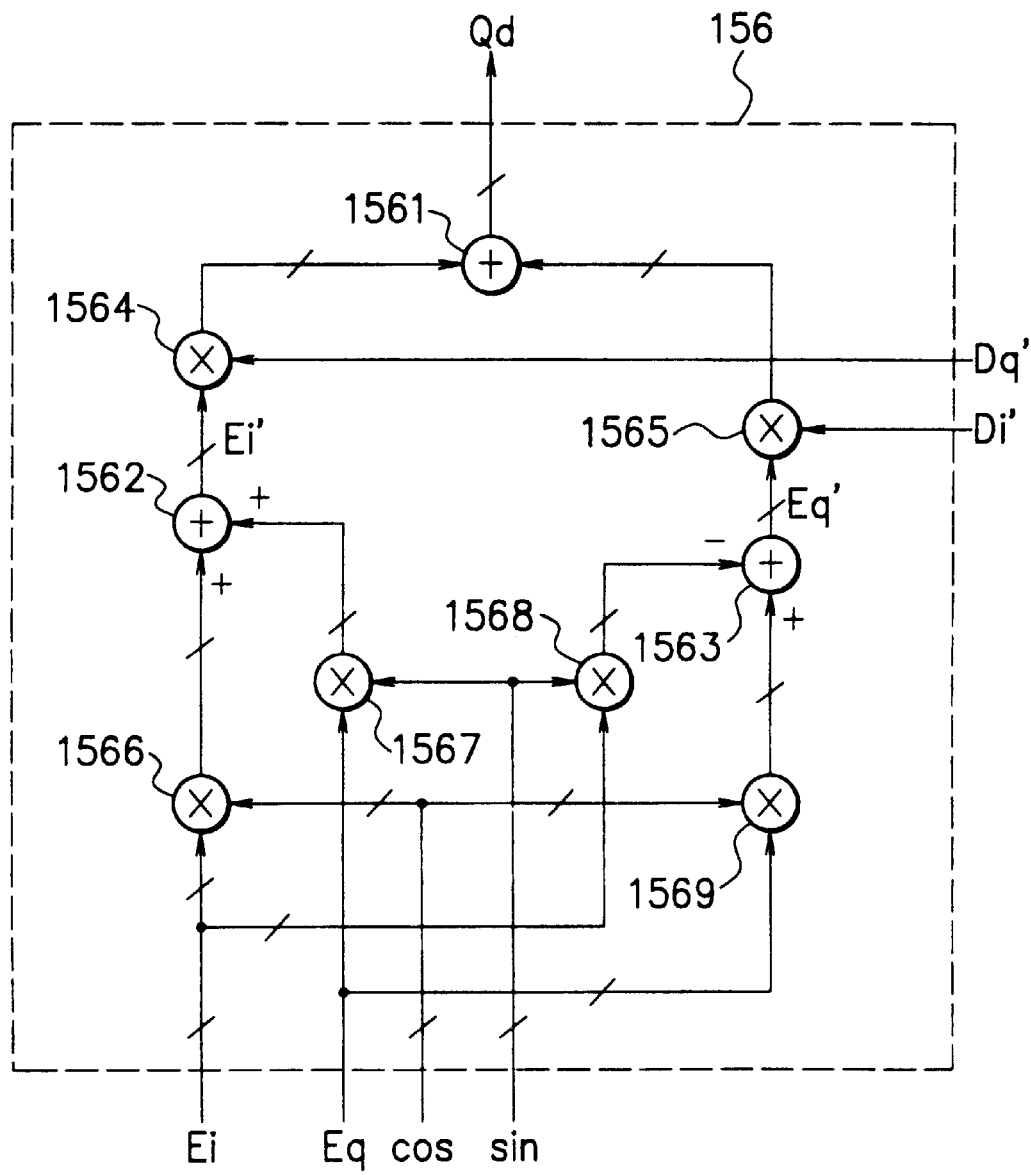
FIG. 25 is a block diagram showing an example of the composition of a quadrature error detector of the quadrature controller of FIG. 24.

FIG. 25 is a block diagram showing an example of the composition of the quadrature error detector 156 of the quadrature controller 15A of FIG. 24. The quadrature error detector 156 shown in FIG. 25 is composed of adders 1561~1563 and multipliers 1564~1569. Part of the quadrature error detector 156 composed of adders 1562 and 1563 and the multipliers 1566~1569 executes phase rotation of reverse direction in comparison with the phase rotation executed by the complex multiplier 8 shown in FIG. 7. Concretely, the part executes the phase rotation to the error vector (Ei, Eq) as:

$$Ei'=Ei\cdot Cos+Eq\cdot Sin$$

$$Eq'=-Ei\cdot Sin+Eq\cdot Cos.$$

The error vector (Ei', Eq') obtained by the above reverse phase rotation indicates the (signal point position) errors Ei' and Eq' before the phase rotation by the complex multiplier 8. The quadrature controller 15A for correcting the quadrature error is placed before the complex multiplier 8 which executes the phase rotation, therefore, the error vector (Ei', Eq') before the phase rotation is estimated from the error vector (Ei, Eq) after the phase rotation by means of the reverse phase rotation.

Figure 26:
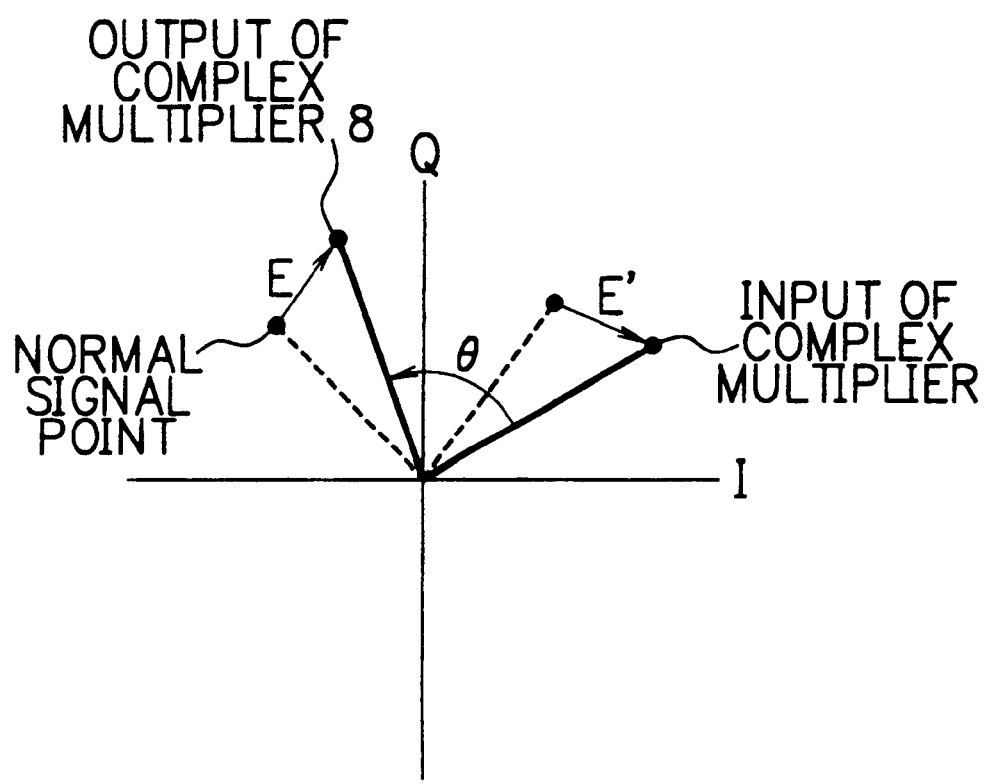
FIG. 26 is a graph showing the relationship between an error vector after the phase rotation and an error vector before the phase rotation in the I-Q complex plane.

FIG. 26 is a graph showing the relationship between the error vector (Ei, Eq) after the phase rotation and the error vector (Ei', Eq') before the phase rotation in the I-Q complex plane. The error vector (Ei, Eq) obtained by the error detector 21 is a vector from the normal signal point to the signal point of the demodulated signals I-ch5 and Q-ch5 (≈a signal point corresponding to the output of the complex multiplier 8). If we assume the complex multiplier 8 executes phase rotation by θ, the signal point of the digital signals I-ch2 and Q-ch2 (≈a signal point corresponding to the input of the complex multiplier 8) can be obtained by rotating the signal point of the demodulated signals I-ch5 and Q-ch5 by −θ. In the same way, the error vector (Ei', Eq') before the phase rotation can be obtained by rotating the error vector (Ei, Eq) by θ. The error vector (Ei', Eq') before the phase rotation is obtained by the aforementioned part of the quadrature error detector 156.

The quadrature error Qd (before the phase rotation) is obtained by the multipliers 1564 and 1565 and the adder 1561 as:

$$Qd=Ei'\cdot Dq'+Eq'\cdot Di'$$

where Di' and Dq' are sign bits of the digital signals I-ch2 and Q-ch2. Incidentally, the polarity signals (Di', Dq') and the error signals (Ei', Eq') have to be obtained from the same signal. However, the error signals (Ei', Eq') is obtained as a result of a loop through the AGC 7, the complex multiplier 8, the AGC 9, the error detector 21 and the part of the quadrature error detector 156. Therefore, the polarity signals (Di', Dq') are supplied to the quadrature error detector 156 through the delay units 154 and 155, in consideration of delay of the error signals (Ei', Eq').

As described above, in the demodulator in accordance with the fourth embodiment of the present invention, the error vector (error signals) (Ei', Eq') before the phase rotation by the complex multiplier 8 is estimated by executing the reverse phase rotation to the error vector (error signals) (Ei, Eq) after the phase rotation, differently from the previous embodiments. The correction of the quadrature error is executed by the LPF 153, the multiplier 152 and the adder 151 of the quadrature controller 15A in the same say as the previous embodiments. Also by the fourth embodiment, the quadrature error due to the phase shift error of the π/2 phase shifter 4 can be corrected and eliminated automatically by means of digital signal processing, with no need of manual control, and thereby deterioration of demodulation properties (bit error rate etc.) can automatically be prevented for the long term.

Incidentally, while QPSK and QAM (16 QAM) have been taken as examples of modulation method in the above description of the preferred embodiments, the IF input signal demodulated by the demodulator according to the present invention is not limited to QPSK signals and QAM signals. The demodulator of the present invention can also be applied to signals which have been modulated by means of other type of QM (Quadrature Modulation) such as other type of PSK (BPSK, 8-phase PSK, etc.), APSK (Amplitude Phase Shift Keying), etc.

As set forth hereinabove, by the demodulator according to the present invention, the quadrature error of the demodulated signals due to the phase shift error of the π/2 phase shifter 4 depending on temperature etc. can be corrected and eliminated automatically by means of digital signal processing. Therefore, deterioration of demodulation properties (bit error rate etc.) can automatically be eliminated for the long term with no need of manual control.

The components of the demodulator after the A/D converters 5 and 6 can be implemented by digital circuits, and thus the components can easily be implemented as an LSI. Therefore, miniaturization and weight reduction of the demodulator are also possible.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A demodulator for demodulating a modulation signal which has been modulated by means of quadrature modulation, comprising:

a quasi-coherent detection means for executing quasi-coherent detection to the modulation signal and thereby outputting quadrature components;

a demodulation means for correcting amplitude errors of the quadrature components outputted by the quasi-coherent detection means, correcting frequency offset components and phase offset components of the quadrature components, and thereby outputting demodulated signals;

a signal error detection means for detecting signal errors and polarities of the demodulated signals;

a phase error detection means for generating a phase error based on the signal errors and the polarities, for use by the demodulation means;

a quadrature error detection means for generating a quadrature error using at least the signal errors; and a quadrature error elimination means, coupled between the quasi-coherent detection means and the demodulation means, for executing complex multiplication to the quadrature components outputted by the quasi-coherent detection means based on the quadrature error generated by the quadrature error detection means and thereby eliminating the quadrature error in the demodulated signals.

2. A demodulator as claimed in claim 1, wherein the quasi-coherent detection means includes:

a local oscillator for generating a local oscillation signal whose frequency is almost the same as that of the carrier of the modulation signal;

a π/2 phase shifter for shifting the phase of the local oscillation signal outputted by the local oscillator by π/2;

a first multiplier for multiplying the modulation signal by the local oscillation signal outputted by the local oscillator;

a second multiplier for multiplying the modulation signal by the π/2-shifted local oscillation signal outputted by the π/2 phase shifter;

a first analog to digital converter for executing analog to digital conversion to the output of the first multiplier and thereby outputting a first quadrature component; and a second analog to digital converter for executing analog to digital conversion to the output of the second multiplier and thereby outputting a second quadrature component.

3. A demodulator as claimed in claim 1, wherein the demodulation means includes:

a first automatic gain controller which is supplied with signals outputted by the quadrature error elimination means for correcting an amplitude difference between the signals and thereby outputting signals in which the amplitude difference has been eliminated;

a complex multiplier which is supplied with the signals outputted by the first automatic gain controller for executing phase rotation to the signals outputted by the first automatic gain controller using phase rotation signals which are generated based on the phase error outputted by the phase error detection means and thereby outputting signals in which frequency offset components and phase offset components have been eliminated; and a second automatic gain controller which is supplied with the signals outputted by the complex multiplier for adjusting amplitudes of the signals outputted by the complex multiplier so that a corresponding signal point will be on a normal signal point and thereby outputting the demodulated signals.

4. A demodulator as claimed in claim 3, further comprising an amplitude error detection means for generating an amplitude error based on the signal errors and the polarities, said amplitude error for use by the second automatic gain controller.

5. A demodulator as claimed in claim 4, wherein the amplitude error detection means generates the amplitude error by multiplying a signal error by a polarity.

6. A demodulator as claimed in claim 1, wherein the signal error detection means generates the signal errors by detecting errors of the demodulated signals in comparison with an i-coordinate and a q-coordinate of a normal signal point, and detects the polarities by detecting sign bits of the demodulated signals.

7. A demodulator as claimed in claim 1, wherein the phase error detection means generates the phase error by calculating the difference between a second signal error multiplied by a first polarity and a first signal error multiplied by a second polarity.

8. A demodulator as claimed in claim 1, wherein the quadrature error detection means includes:

a quadrature error calculation means for obtaining an other quadrature error by calculating the sum of a first signal error multiplied by a second polarity and a second signal error multiplied by a first polarity; and a polarity switching means for judging whether or not a signal point of signals in which an amplitude difference has been eliminated, said signal point being in a complex plane before phase rotation executed in the demodulation means, existed in a quadrant adjacent to an other quadrant where an other signal point of the demodulated signals after the phase rotation exists, said judging based on the-demodulated signals and a phase rotation angle signal which is generated from the phase error generated by the phase error detection means, said polarity switching means inverting a polarity of the other quadrature error and outputting the inverted other quadrature error as the quadrature error when the signal point of the signals in which an amplitude difference has been eliminated existed in said quadrant adjacent to said other quadrant, and directly outputting the other quadrature error as the quadrature error when the signal point of the signals in which an amplitude difference has been eliminated did not exist in said quadrant adjacent to said other quadrant.

9. A demodulator as claimed in claim 1, further comprising a diagonal line detection means for judging whether or not each signal point of the demodulated signals is a diagonal signal point, wherein the quadrature error detection means generates the quadrature error based on the signal errors, the polarities, the output of the diagonal line detection means, and a phase rotation angle signal which is generated from the phase error detected by the phase error detection means.

10. A demodulator as claimed in claim 9, wherein the quadrature error detection means includes:

a quadrature error calculation means for obtaining a quadrature error by calculating the sum of a first signal error multiplied by a second polarity and a second signal error multiplied by a first polarity;

a polarity switching means for judging whether or not a signal point of signals in which an amplitude difference has been eliminated, said signal point being in a complex plane before phase rotation executed in the demodulation means, existed in a quadrant adjacent to an other quadrant where an other signal point of the demodulated signals after the phase rotation exists, said judging based on the phase rotation angle signal, said polarity switching means inverting a polarity of the other quadrature error and outputting the inverted other quadrature error as the quadrature error when the signal point of the signals in which the amplitude difference has been eliminated existed in said quadrant adjacent to said other quadrant, and directly outputting the other quadrature error as the quadrature error when the signal point of the signals in which the amplitude difference has been eliminated did not exist in said quadrant adjacent to said other quadrant; and an output ON/OFF means for turning the output of the polarity switching means on or off depending on the output of the diagonal line detection means.

11. A demodulator as claimed in claim 1, wherein the quadrature error detection means includes:

a quadrature error calculation means for obtaining an other quadrature error by calculating the sum of a first signal error multiplied by a second polarity and a second signal error multiplied by a first polarity; and a polarity switching means for judging whether or not a signal point of the signals in which an amplitude difference has been eliminated, said signal point being in a complex plane before phase rotation executed in the demodulation means, existed in a quadrant adjacent to an other quadrant where an other signal point of the demodulated signals after the phase rotation exists, said judging based on a phase rotation angle signal which is generated from the phase error detected by the phase error detection means, said polarity switching means inverting a polarity of the other quadrature error and outputting the inverted other quadrature error as the quadrature error when. the signal point of the signals in which the amplitude difference has been eliminated existed in said quadrant adjacent to said other quadrant, and directly outputting the other quadrature error as the quadrature error when the signal point of the signals in which the amplitude difference has been eliminated did not exist in said quadrant adjacent to said other quadrant.

12. A demodulator as claimed in claim 1, wherein the quadrature error detection means includes:

a reverse phase rotation means for executing phase rotation to the signal errors in a reverse direction in comparison with the phase rotation executed in the demodulation means using phase rotation signals which are generated based on the phase error outputted by the phase error detection means and thereby obtaining other signal errors before the phase rotation; and a quadrature error calculation means for obtaining the quadrature error based on the other signal errors before the phase rotation and other polarities of signals outputted by the quadrature error elimination means before the phase rotation by calculating the sum of a first other signal error multiplied by a second other polarity and a second other signal error multiplied by a first other polarity.

13. A demodulator as claimed in claim 1, wherein the quadrature error elimination means eliminates the quadrature error in the demodulated signals by smoothing the quadrature error outputted by the quadrature error detection means by a lowpass filter, multiplying a second quadrature component by the smoothed quadrature error, and adding the product to a first quadrature component.

14. A demodulation method for demodulating a modulation signal which has been modulated by means of quadrature modulation, comprising the steps of:

a quasi-coherent detection step in which quasi-coherent detection is executed to the modulation signal and thereby quadrature components are obtained;

a demodulation step in which amplitude errors of the quadrature components obtained in the quasi-coherent detection step are corrected, frequency offset components and phase offset components of the quadrature components are corrected, and thereby demodulated signals are obtained;

a signal error detection step in which signal errors and polarities of the demodulated signals are detected;

a phase error detection step in which a phase error of the demodulated signals is generated based on the signal errors and the polarities for use in the demodulation step;

a quadrature error detection step in which a quadrature error is generated using at least the signal errors; and a quadrature error elimination step in which complex multiplication is executed to the quadrature components obtained in the quasi-coherent detection step based on the quadrature error generated in the quadrature error detection step and thereby the quadrature error in the demodulated signals is eliminated.

15. A demodulation method as claimed in claim 14, wherein the quasi-coherent detection step includes the steps of:

a local oscillation step in which a local oscillation signal whose frequency is almost the same as that of the carrier of the modulation signal is generated;

a $\pi/2$ phase shift step in which the phase of the local oscillation signal generated in the local oscillation step is shifted by $\pi/2$;

a first multiplication step in which the modulation signal is multiplied by the local oscillation signal generated in the local oscillation step;

a second multiplication step in which the modulation signal is multiplied by the $\pi/2$-shifted local oscillation signal obtained in the $\pi/2$ phase shift step;

a first analog to digital conversion step in which analog to digital conversion is executed to the signal obtained in the first multiplication step and thereby a first quadrature component is obtained; and a second analog to digital conversion step in which analog to digital conversion is executed to the signal obtained in the second multiplication step and thereby a second quadrature component is obtained.

16. A demodulation method as claimed in claim 14, wherein the demodulation step includes the steps of:

a first automatic gain controller step in which an amplitude difference between the signals obtained in the quadrature error elimination step is corrected and thereby signals in which the amplitude difference has been eliminated are obtained;

a complex multiplication step in which phase rotation is executed to the signals obtained in the first automatic gain controller step using phase rotation signals which are generated based on the phase error generated in the phase error detection step and thereby signals in which frequency offset components and phase offset components have been eliminated are obtained; and a second automatic gain controller step in which amplitudes of the signals obtained in the complex multiplication step are adjusted so that a corresponding signal point will be on a normal signal point, and thereby the demodulated signals are obtained.

17. A demodulation method as claimed in claim 16, further comprising an amplitude error detection step in which an amplitude error of the demodulated signals is generated based on the signal errors and the polarities so as to be used in the second automatic gain controller step.

18. A demodulation method as claimed in claim 17, wherein the amplitude error is generated in the amplitude error detection step by multiplying a signal error by a polarity.

19. A demodulation method as claimed in claim 14, wherein in the signal error detection step, the signal errors are generated by detecting errors of the demodulated signals in comparison with an i-coordinate and a q-coordinate of a normal signal point, and the polarities of the demodulated signals are generated by detecting sign bits of the demodulated signals.

20. A demodulation method as claimed in claim 14, wherein the phase error is generated in the phase error detection step by calculating the difference between a second signal error multiplied by a first polarity and a first signal error multiplied by a second polarity.

21. A demodulation method as claimed in claim 14, wherein the quadrature error detection step includes the steps of:
   a quadrature error calculation step in which an other quadrature error is obtained by calculating the sum of a first signal error multiplied by a second polarity and a second signal error multiplied by a first polarity; and
   a polarity switching step in which it is judged whether or not a signal point of signals in which an amplitude difference has been eliminated, said signal point being in a complex plane before phase rotation executed in the demodulation step, existed in a quadrant adjacent to an other quadrant where an other signal point of the demodulated signals after the phase rotation exists, said judgment based on the demodulated signals and a phase rotation angle signal which is generated from the phase error generated in the phase error detection step, a polarity of the other quadrature error is inverted and the inverted other quadrature error is regarded as the quadrature error when the signal point of the signals in which an amplitude difference has been eliminated existed in said quadrant adjacent to said other quadrant, and the other quadrature error is regarded as the quadrature error when the signal point of the signals in which an amplitude difference has been eliminated did not exist in said quadrant adjacent to said other quadrant.

22. A demodulation method as claimed in claim 14, further comprising a diagonal line detection step in which it is judged whether or not each signal point of the demodulated signals is a diagonal signal point, wherein the quadrature error is generated in the quadrature error detection step based on the signal errors, the polarities, the result of the diagonal line detection step, and a phase rotation angle signal which is generated from the phase error detected in the phase error detection step.

23. A demodulation method as claimed in claim 22, wherein the quadrature error detection step includes the steps of:
   a quadrature error calculation step in which an other quadrature error is obtained by calculating the sum of a first signal error multiplied by a second polarity and a second signal error multiplied by a first polarity;
   a polarity switching step in which it is judged whether or not a signal point of the signals in which the amplitude difference has been eliminated, said signal point being in a complex plane before phase rotation executed in the demodulation step, existed in a quadrant adjacent to an other quadrant where an other signal point of the demodulated signals after the phase rotation exists, said judgment based on a phase rotation angle signal, a polarity of the other quadrature error is inverted and the inverted other quadrature error is regarded as the quadrature error when the signal point of the signals in which the amplitude difference has been eliminated existed in said quadrant adjacent to said other quadrant, and the other quadrature error is regarded as the quadrature error if the signal point of the signals in which the amplitude difference has been eliminated did not exist in said quadrant adjacent to said other quadrant; and
   a quadrature error switching step in which the quadrature error to be used in the quadrature error elimination step is switched between 0 and the result of the polarity switching step depending on the result of the diagonal line detection step.

24. A demodulation method as claimed in claim 14, wherein the quadrature error detection step includes the steps of:
   a quadrature error calculation step in which an other quadrature error is obtained by calculating the sum of a first signal error multiplied by a second polarity and a second signal error multiplied by a first polarity; and
   a polarity switching step in which it is judged whether or not a signal point of the signals in which an amplitude difference has been eliminated, said signal point being in a complex plane before phase rotation executed in the demodulation step, existed in a quadrant adjacent to an other quadrant where an other signal point of the demodulated signals after the phase rotation exists, said judgment based on a phase rotation angle signal which is generated from the phase error generated by the phase error detection means, a polarity of the other quadrature error is inverted and the inverted other quadrature error is regarded as the quadrature error when the signal point of the signals in which an amplitude difference has been eliminated existed in an said quadrant adjacent to said other quadrant, and the other quadrature error is regarded as the quadrature error when the signal point of the signals in which an amplitude difference has been eliminated did not exist in said quadrant adjacent to said other quadrant.

25. A demodulation method as claimed in claim 14, wherein the quadrature error detection step includes the steps of:
   a reverse phase rotation step in which phase rotation is executed to the signal errors in reverse direction in comparison with the phase rotation executed in the demodulation step using phase rotation signals which are generated based on the phase error generated detected in the phase error detection step and thereby other signal errors before the phase rotation are obtained; and
   a quadrature error calculation step in which the quadrature error is obtained based on the other signal errors before the phase rotation and other polarities of signals outputted by the quadrature error elimination means before the phase rotation by calculating the sum of a first other signal error multiplied by a second other polarity and a second other signal error multiplied by a first other polarity.

26. A demodulation method as claimed in claim 14, wherein the quadrature error in the demodulated signals is eliminated in the quadrature error elimination step by smoothing the quadrature error generated in the quadrature error detection step, multiplying a second quadrature component by the smoothed quadrature error, and adding the product to a first quadrature component.

* * * * *

UNITED STATES PATENT AND TRADEMARK OFFICE
CERTIFICATE OF CORRECTION

PATENT NO. : 6,310,513 B1
DATED : October 30, 2001
INVENTOR(S) : Takaya Iemura

It is certified that error appears in the above-identified patent and that said Letters Patent is hereby corrected as shown below:

Column 4,
Line 15, delete "Eq ·Di ·Ei ·Dq" insert -- Eq ·Di -Ei ·Dq. --

Column 7,
Line 10, delete "Eq ·Di ·Ei ·Dq" insert -- Eq ·Di- Ei ·Dq. --

Column 11,
Line 10, delete "I-ch6" insert -- I-ch5 --

Column 12,
Line 16, delete "I-ch4=I-ch3·Cos·Q-chsSin" insert -- I-ch4=I-ch3·Cos-Q-ch3·Sin --

Column 17,
Line 18, delete "(=Eq·Di·Ei·Dq)" insert -- (=Eq·Di -Ei·Dq) --;
Line 38, delete "Eq´=·Ei·Sin·+Eq·Cos." insert -- Eq´=-Ei·Sin+Eq·Cos. --

Signed and Sealed this

First Day of October, 2002

Attest:

JAMES E. ROGAN
Attesting Officer    Director of the United States Patent and Trademark Office